(12) United States Patent
Shimura et al.

(10) Patent No.: US 6,914,257 B2
(45) Date of Patent: Jul. 5, 2005

(54) MAGNETORESISTIVE DEVICE AND METHOD OF PRODUCING THE SAME

(75) Inventors: Ken-ichi Shimura, Tokyo (JP); Hisanao Tsuge, Tokyo (JP); Atsushi Kamijo, Tokyo (JP); Tsutomu Mitsuzuka, Tokyo (JP); Yoshiyuki Fukumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 89 days.

(21) Appl. No.: 10/122,933

(22) Filed: Apr. 16, 2002

(65) Prior Publication Data

US 2003/0008416 A1 Jan. 9, 2003

(30) Foreign Application Priority Data

Apr. 16, 2001 (JP) ........................................ 2001-116972

(51) Int. Cl.$^7$ .............................................. H01L 29/06
(52) U.S. Cl. ........................................................ 257/24
(58) Field of Search ................................ 257/9, 30, 35, 257/4, 12, 14, 24, 295, E29.164, E21.208, E21.664, E21.665; 438/3; 265/158, 171, 173; 360/314, 324.2; 365/158, 171

(56) References Cited

U.S. PATENT DOCUMENTS

| | | | | |
|---|---|---|---|---|
| 5,416,353 A | * | 5/1995 | Kamiguchi et al. | ......... 257/421 |
| 6,108,177 A | * | 8/2000 | Gill | ........................ 360/324.12 |
| 6,347,049 B1 | * | 2/2002 | Childress et al. | ........... 365/173 |
| 6,452,204 B1 | * | 9/2002 | Ishiwata et al. | ................ 257/9 |

FOREIGN PATENT DOCUMENTS

| | | |
|---|---|---|
| JP | 11-181564 | 7/1999 |
| JP | 2000-36628 | 2/2000 |
| JP | 2000-91666 | 3/2000 |
| JP | 2000-150984 | 5/2000 |
| JP | 2000-251229 | 9/2000 |
| JP | 2000251230 A * | 9/2000 ............ G11B/5/39 |
| JP | 2000-322714 | 11/2000 |
| JP | 2000-331472 | 11/2000 |
| JP | 2000-357829 | 12/2000 |
| JP | 2001-57450 | 2/2001 |

OTHER PUBLICATIONS

James Bain et al., "High–Density Magnetic Recording and Integrated Magnetic–Optics: Materials and Devices", Materials Research Society Symposium Proceedings vol. 517, Symposium held Apr. 12–16, 1998, San Francisco California.

S. S. P. Parkin et al., "Exchange–Biased Magnetic Tunnel Junctions and Application to Nonvolatile Magnetic Random Access Memory (Invited)", Apr. 15, 1999, vol. 85, No. 8.

* cited by examiner

*Primary Examiner*—George Fourson
*Assistant Examiner*—Brook Kebede
(74) *Attorney, Agent, or Firm*—Young & Thompson

(57) ABSTRACT

In accordance with a method of producing an MR (MagnetoResistive) device including a ferromagnetic tunnel junction made up of a first ferromagnetic layer, an insulation layer formed on the first ferromagnetic layer and a second ferromagnetic layer formed on the insulation layer, a metal or a semiconductor is deposited on the first ferromagnetic layer. The metal or the semiconductor is then caused to react to oxygen of a ground level to become an oxide layer, which is the oxide of the metal or that of the semiconductor. Subsequently, the oxide layer is caused to react to oxygen of an excitation level to form the insulation layer. The second ferromagnetic layer is formed on the insulation layer.

4 Claims, 25 Drawing Sheets

FIG. 22

| | STANDARDIZED RESISTANCE ($\Omega \cdot \mu m^2$) | MR RATIO (%) | YIELD |
|---|---|---|---|
| 1ST EX. | 135k | 37 | 100% |
| 2ND EX. | 730k | 38 | 98% |
| 3RD EX. | 1.5M | 38 | 98% |
| 1ST COMP. EX. | 0.2k | 18 | 100% |
| 2ND COMP. EX. | 1.3M | 27 | 40% |

FIG. 23

| | STANDARDIZED RESISTANCE (Ω·μm²) | MR RATIO (%) | YIELD |
|---|---|---|---|
| 5TH EX. | 5.1k | 40 | 96% |
| 6TH EX. | 9.7k | 42 | 100% |
| 7TH EX. | 6.6M | 38 | 100% |
| 8TH EX. | 7.3k | 39 | 100% |
| 3RD COMP. EX. | 2.9M | 21 | 52% |
| 4TH COMP. EX. | 4.2M | 34 | 42% |

FIG. 24

| STANDARDIZED RESISTANCE (Ω·μm²) | MR RATIO (%) | YIELD |
|---|---|---|
| 9TH EX. | | |
| 1.3M | 39 | 98% |
| 5TH COMP. EX | | |
| 710k | 23 | 80% |

FIG. 25

| STANDARDIZED RESISTANCE (Ω·μm²) | MR RATIO (%) | YIELD |
|---|---|---|
| 11TH EX. | | |
| 2.3M | 41 | 98% |
| 6TH COMP. EX. | | |
| 1.1M | 23 | 32% |

FIG. 26

| | 1ST Aℓ THICKNESS (nm) | 2ND Aℓ THICKNESS (nm) | NITRIFYING TIME (min) | OXIDIZING TIME (min) | STANDARDIZED RESISTANCE (Ω·μm²) | MR RATIO (%) | YIELD (%) |
|---|---|---|---|---|---|---|---|
| 14TH EX. | 0.7 | 0.8 | 5 | 10 | 390k | 36 | 100 |
| 15TH EX. | 0.7 | 0.8 | 10 | 10 | 410k | 38 | 100 |
| 16TH EX. | 0.7 | 0.8 | 10 | 10 | 680k | 40 | 100 |
| 17TH EX. | NITRIFYING Aℓ THICKNESS (nm) 1.0 | 2ND Aℓ THICKNESS (nm) 0.8 | | OXIDIZING TIME (min) 10 | STANDARDIZED RESISTANCE (Ω·μm²) 380k | MR RATIO (%) 38 | YIELD (%) 100 |
| 7TH COMP. EX. | Aℓ THICKNESS (nm) 1.5 | | | 10 | 2.1M | 26 | 36 |
| 8TH COMP. EX. | 1.5 | | | 20 | 8.2M | 18 | 24 |

FIG. 27

| | 1ST TO 3RD Al THICKNESSES (nm) | NITRIFYING TIME (min) | OXIDIZING TIME (min) | STANDARDIZED RESISTANCE (Ω·μm²) | MR RATIO (%) | YIELD (%) |
|---|---|---|---|---|---|---|
| 18TH EX. | 0.7 | 20 | 5 | 3.4M | 34 | 100 |
| 19TH EX. | 0.7 | 20 | 10 | 6.5M | 36 | 98 |
| 20TH EX. | 0.7 | 20 | 15 | 7.0M | 36 | 98 |
| | Al THICKNESS (nm) | NITRIFYING TIME (min) | | STANDARDIZED RESISTANCE (Ω·μm²) | MR RATIO (%) | YIELD (%) |
| 9TH COMP. EX | 2.1 | 50 | | 380k | 14 | 100 |

FIG. 28

| | STANDARDIZED RESISTANCE ($\Omega \cdot \mu m^2$) | MR RATIO (%) | YIELD (%) |
|---|---|---|---|
| 21TH EX. | 5.5M | 34 | 96 |

MAGNETORESISTIVE DEVICE AND METHOD OF PRODUCING THE SAME

BACKGROUND OF THE INVENTION

1. Field of the Invention

The present invention relates to an MR (MagnetoResistive) device with a ferromagnetic tunnel junction implemented by an insulation layer and ferromagnetic layers sandwiching the insulation layer, and a method of producing the same.

2. Description of the Background Art

A ferromagnetic tunnel junction has a tunnel barrier layer and two ferromagnetic layers sandwiching the tunnel barrier layer. The tunnel barrier layer is implemented as a several nanometers thick insulator. Electric resistance between the two ferromagnetic layers varies in accordance with a relative angle between the magnetizations of two ferromagnetic materials. More specifically, the electric resistance is minimum when the magnetizations are parallel or maximum when they are not parallel.

The difference of the electric resistance between the parallel state and the non-parallel state of the two magnetizations is generally represented by an MR ratio. Specifically, assume that the two ferromagnetic materials have spin polarization P1 and P2, respectively. Then, the MR ratio is expressed as $2(P1 \cdot P2)/(1-P1 \cdot P2)$. This shows that the above difference increases with an increase in the spin polarization of the two ferromagnetic materials. By using the dependence of the electric resistance on the relative angle, it is possible to produce an MR device for sensing the variation of an external magnetic field in terms of the variation of the electric resistance.

Technologies for allowing a ferromagnetic tunnel junction to be applied to an MR device include one that has been customary with a spin valve. A spin valve includes two ferromagnetic layers magnetically isolated from each other by a nonmagnetic layer. An antiferromagnetic layer is stacked on one of the ferromagnetic layers. The ferromagnetic layer underlying the antiferromagnetic layer is a fixed layer whose direction of magnetization is fixed by an interchange-couple magnetic field. The other ferromagnetic layer is a free layer whose direction of magnetization varies in accordance with the external magnetic field. In this configuration, the direction of magnetization of the free layer spins due to the external magnetic field, but the magnetization of the fixed layer does not spin. This makes it possible to vary the relative angle between the magnetization of the free layer and that of the fixed layer on the basis of the external magnetic field. Assuming that the nonmagnetic layer intervening between the ferromagnetic layers is the tunnel barrier layer, then the spin valve technology is applicable to the ferromagnetic tunnel junction. The variation of the external magnetic field can be sensed in terms of the variation of tunnel resistance.

To form the tunnel barrier layer of a ferromagnetic tunnel junction, it is a common practice to form a metal or semiconductor film, which is several nanometers thick or less, on a ferromagnetic layer and then oxidize the metal or the semiconductor for thereby making it insulative. In many cases, use is made of aluminum desirably adhering to an underlying magnetic layer and capable of forming a tunnel barrier layer having a desirable covering ability.

Methods available for oxidizing aluminum are generally classified into a native oxidizing method using oxygen of a ground level and a method using a radical, plasma or similar oxygen of an excitation level, as will be described hereinafter.

The native oxidizing method forms an aluminum film on an underlying magnetic material and then holds them in an oxygen gas atmosphere to thereby oxidize the aluminum film. The resulting tunnel barrier layer, which has a low barrier and a low junction resistance, is applied to a ferromagnetic tunnel junction for a magnetic head. H. Tsuge et al., for (example, report a ferromagnetic tunnel junction using such a tunnel barrier layer in "Materials Research Society Symposium Proceedings", Vol. 517, 87 (1998). The junction taught in this report has a standardized junction resistance of 240 $\Omega \cdot \mu m^2$ and an MR ratio of 12%.

The method using oxygen of the excitation level implements a tunnel barrier layer whose junction resistance is as high as the order of $k\Omega \cdot \mu m^2$ or above. S. Parkin et al., for example, teaches a tunnel barrier layer with a ferromagnetic tunnel junction having a junction resistance of 11 $M\Omega \cdot \mu m^2$ in "Journal of Applied Physics", 85, 5828 (1999). To form the tunnel barrier layer, aluminum is oxidized by oxygen plasma.

Another possible method of forming a tunnel barrier layer is directly depositing aluminum oxide. This method, however, has a problem that the barrier characteristics deteriorate due to the loss of oxygen. Another problem is that aluminum oxide is less adhesive to the underlying layer than aluminum, resulting in micro-defects.

Ideally, the MR ratio of a ferromagnetic tunnel junction is dependent on the spin polarization of a ferromagnetic material, as stated above. In practice, however, the interface between the ferromagnetic material and the tunnel barrier layer or insulation layer is not perfect. For example, in a tunnel barrier layer using aluminum oxide, it is likely that non-oxidized aluminum remains due to short oxygen or even the underlying ferromagnetic layer is oxidized due to excessive oxidation. As a result, the effective spin polarization of the ferromagnetic material and therefore the MR ratio decreases.

The native oxidizing method causes oxygen of the ground level to slowly oxidize, e.g., a metal and therefore oxidizes a ferromagnetic material underlying the metal little. However, an oxidizing force available with this method is weak and apt to leave a non-oxidized aluminum layer between an aluminum oxide layer and a ferromagnetic layer underlying it. As a result, spin diffusion occurs in electrons migrating between the ferromagnetic layer and a ferromagnetic layer, which overlies the aluminum oxide layer, on the basis of the tunnel effect. The spin diffusion lowers the MR ratio.

By contrast, the method using plasma or similar oxygen of the excitation level exerts an oxidizing force strong enough to leave a minimum of non-oxidized aluminum. This method therefore provides a ferromagnetic tunnel junction with a high junction resistance. However, oxidation is apt to extend to a ferromagnetic layer or bottom layer because the intense oxidizing force is difficult to control. The oxidation extended to the ferromagnetic layer forms a ferromagnetic oxide layer between the layer and an aluminum oxide layer, lowering the MR ratio. Moreover, such oxidation makes the interface between the tunnel barrier layer and the ferromagnetic layer unstable while lowering the resistivity of the ferromagnetic tunnel junction to voltage.

To realize a high quality ferromagnetic tunnel junction with a high MR ratio, it is necessary to obviate the non-oxidized aluminum, the oxidation of the underlying ferromagnetic layer, and the defects of the interface and tunnel barrier discussed above.

Technologies relating to the present invention are also disclosed in, e.g., Japanese Patent Laid-Open Publication Nos. 11-181564, 2000-36628, 2000-91666, 2000-150984, 2000-251229, 2000-322714, 2000-331472, 2000-357829 and 2001-57450.

SUMMARY OF THE INVENTION

It is an object of the present invention to provide an MR device with a ferromagnetic tunnel junction having a high MR ratio and high reliability, and a method of producing the same.

In accordance with the present invention, a method of producing an MR device including a ferromagnetic tunnel junction made up of a first ferromagnetic layer, an insulation layer formed on the first ferromagnetic layer and a second ferromagnetic layer formed on the insulation layer, deposits a metal or a semiconductor on the first ferromagnetic layer. The metal or the semiconductor is then caused to react to oxygen of a ground level to become an oxide layer, which is the oxide of the metal or that of the semiconductor. Subsequently, the oxide layer is caused to react to oxygen of an excitation level to form the insulation layer. The second ferromagnetic layer is formed on the insulation layer.

Also, in accordance with the present invention, an MR device includes two ferromagnetic layers constituting a ferromagnetic tunnel junction and each being formed of a ferromagnetic material. A tunnel barrier layer includes a plurality of insulation layers, which include a layer of an oxide of a metal or an oxide of a semiconductor, and is sandwiched between the two ferromagnetic layers. At least one of two insulation layers contacting the two ferromagnetic layers is formed of a substance less reactive to a substance constituting the ferromagnetic layers than the above oxide.

BRIEF DESCRIPTION OF THE DRAWINGS

The above and other objects, features and advantages of the present invention will become more apparent from the following detailed description taken with the accompanying drawings in which:

FIGS. 22 through 28 are tables comparing the examples of the illustrative embodiments and comparative examples as to characteristics.

DESCRIPTION OF THE PREFERRED EMBODIMENTS

To better understand the present invention, the native oxidizing method using oxygen of the ground level and the method using a radical, plasma or similar oxygen of the excitation level will be described more specifically hereinafter.

Figure 1A:
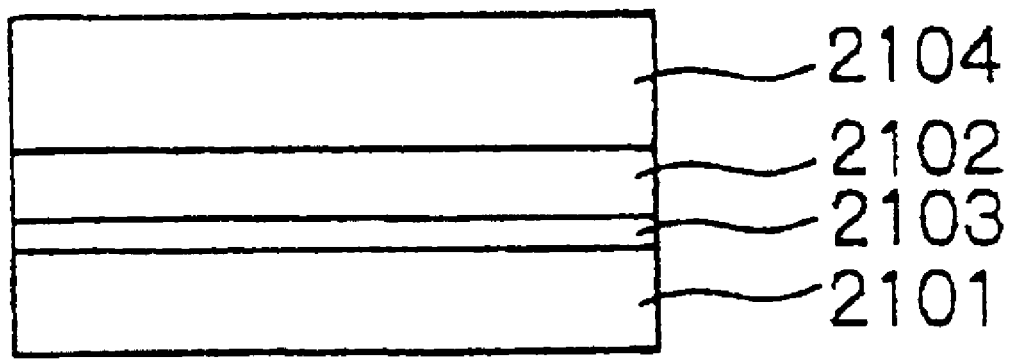
FIG. 1 is a view for describing a conventional method of producing an MR method.

The native oxidizing method causes oxygen of the ground level to slowly oxidize, e.g., a metal and therefore oxidizes a ferromagnetic material underlying the metal little. However, as shown in FIG. 1A specifically, an oxidizing force available with this method is weak and apt to leave a non-oxidized aluminum layer 2103 between an aluminum oxide layer 2102 and a ferromagnetic layer 2101 underlying it. As a result, spin diffusion occurs electrons migrating between the ferromagnetic layer 2101 and a ferromagnetic layer 2104, which overlies the aluminum oxide layer 2102, on the basis of the tunnel effect. Spin diffusion lowers the MR ratio.

Figure 1B:
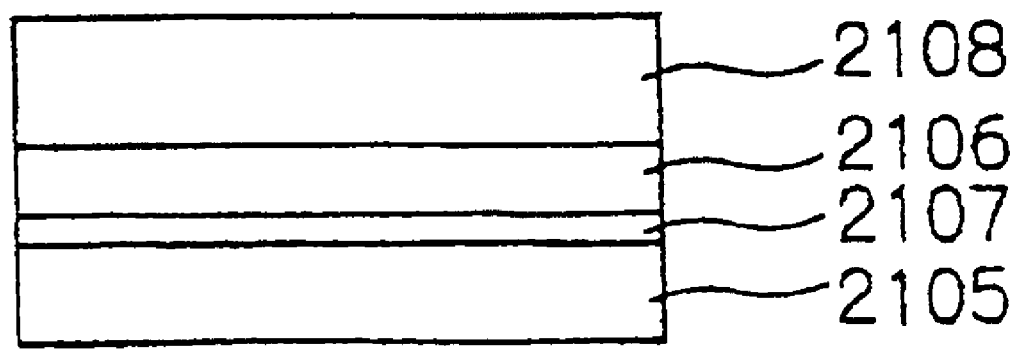

By contrast, the method using oxygen of the excitation level exerts an oxidizing force strong enough to leave a minimum of non-oxidized aluminum. This method therefore provides a ferromagnetic tunnel junction with a high junction resistance. However, as shown in FIG. 1B specifically, oxidation is apt to extend to a ferromagnetic layer or bottom layer 2105 because the intense oxidizing force is difficult to control. The oxidation extended to the ferromagnetic layer 2105 forms a ferromagnetic oxide layer 2107 between the layer 2105 and an aluminum oxide layer 2106, lowering the MR ratio. Moreover, such oxidation makes the interface between the tunnel barrier layer and the ferromagnetic layer unstable while lowering the resistivity of the ferromagnetic tunnel junction to voltage.

Figure 2A:
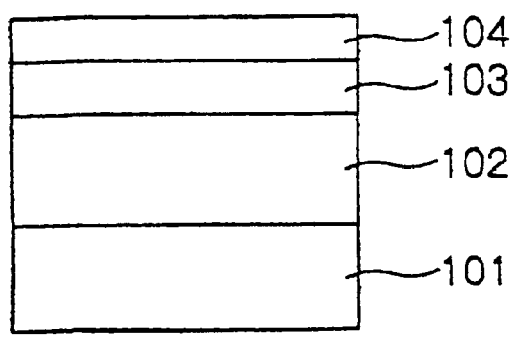
FIGS. 2A through 2D are views demonstrating a procedure for producing a first embodiment of the MR device in accordance with the present invention.
Figure 2C:
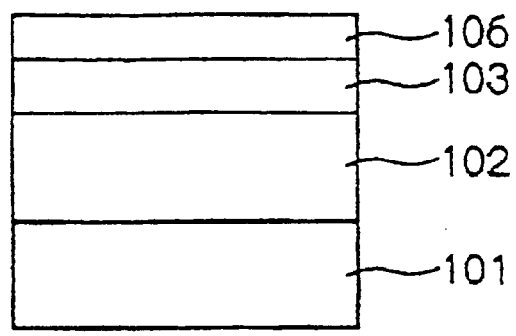
Figure 2B:
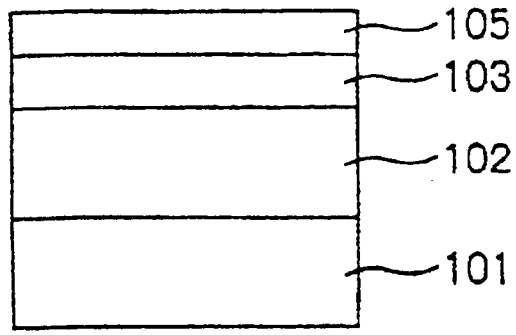
Figure 2D:
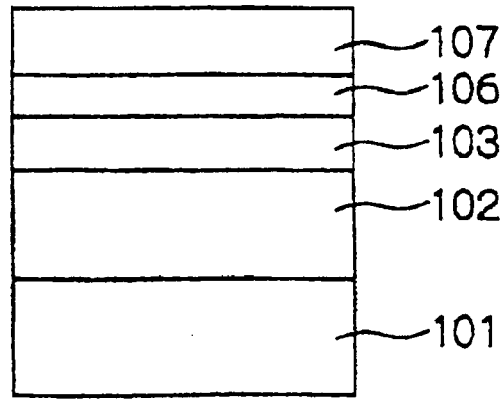

Referring to FIGS. 2A through 2D, a first embodiment of the MR device in accordance with the present invention will be described. First, as shown in FIG. 2A, an antiferromagnetic layer 102, a fixed layer 103 and a metal or semiconductor layer 104 are sequentially formed on an insulative substrate 101. The fixed layer is formed of a first ferromagnetic material. Subsequently, as shown in FIG. 2B, the metal or semiconductor layer 104 is oxidized by oxygen of the ground level, forming a first-stage oxide layer 105. As shown in FIG. 2C, oxygen of the excitation level is fed to the surface of the first-stage oxide layer 105 to thereby transform the layer 105 to a second-stage oxide layer 106. Finally, as shown in FIG. 2D, a free layer 107 implemented by a second ferromagnetic layer is formed on the second-stage oxide layer 106.

For the first and second ferromagnetic materials, use may be made of any one of Fe, Co, Ni, alloys thereof, NiMnSb and other conventional ferromagnetic materials. Further, each ferromagnetic material may even be a laminate of such ferromagnetic materials. The antiferromagnetic layer 102 may be implemented by Fe—Mn, Ir—Mn, Pt—Mn, Ni—Mn, Pd—Mn or similar alloy. For the metal or semiconductor layer 104, use may be made of an element highly insulative and able to form a nonmagnetic oxide, e.g., silicon, germanium or similar semiconductor, aluminum, magnesium yttrium, lanthanoids or similar metal.

Figure 3A:
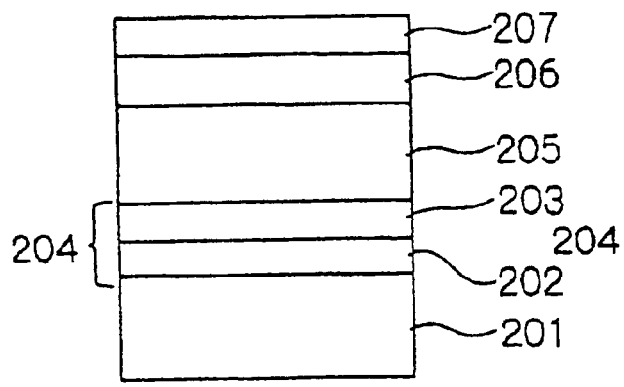
FIGS. 3A through 3D are views showing an example of the first embodiment.

Specific examples of the illustrative embodiment will be described hereinafter with reference to FIGS. 3A through 3D. First, as shown in FIG. 3A, a buffer layer 204 was formed on the thermally oxidized surface of a Si substrate 201. The buffer layer 204 was made up of a 5 nm thick, Ta layer 202 and a 5 nm thick, $Ni_{0.81}Fe_{0.19}$ layer 203. A 10 nm thick, antiferromagnetic layer 205, a 2.5 nm thick, fixed layer 206 and an Al layer 207 were sequentially formed on the buffer layer 204. The antiferromagnetic layer 205 and fixed layer 206 were formed of FeMn and CoFe, respectively. The buffer layer 204 to the Al layer were continuously formed by sputtering in the same vacuum. A background pressure before film forming was $1\times10^{-5}$ Pa or below while an Ar pressure during sputtering was 0.7 Pa.

Figure 3C:
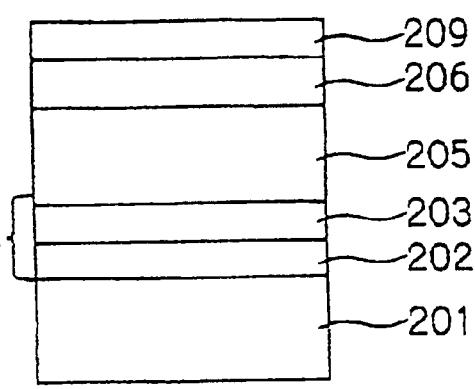
Figure 3B:
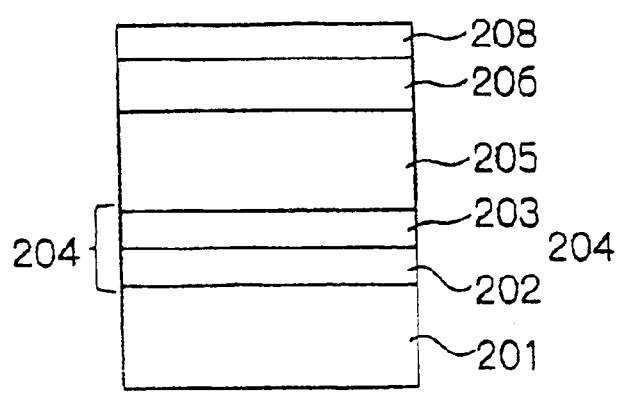
Figure 3D:
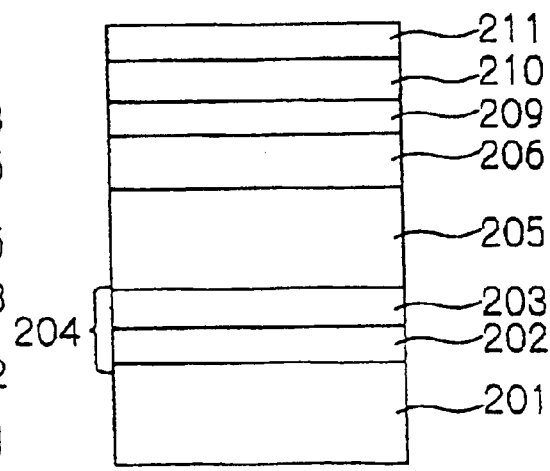

As shown in FIG. 3B, the Al layer 207 was oxidized by oxygen to become a first-stage aluminum oxide layer 208. For this purpose, oxygen gas of the ground level was sent into a sputtering chamber up to a pressure of 25 kPa, and then the laminate was held in the sputtering chamber for 20 minutes. As shown in FIG. 3C, after the sputtering chamber had been exhausted, oxygen of the excitation level was fed to the surface of the first-stage aluminum oxide layer 208. As a result, the aluminum layer 208 was transformed to a second-stage aluminum oxide layer 209. Finally, as shown in FIG. 3D, the sputtering chamber was exhausted to the background pressure, and then a 10 nm thick, $Ni_{0.81}Fe_{0.19}$ free layer 210 was formed. Further, a 5 nm thick, Ta layer 211 was formed on the free layer 210 for protecting the surface of the free layer 210.

The buffer layer 204 allows antiferromagnetic FeMn with a face-centered γ phase to grow. The $Ni_{0.81}Fe_{0.19}$ layer 203 should therefore have (111) orientation. The Ta layer 202 plays the role of a seed layer for controlling the orientation of the $Ni_{0.81}Fe_{0.19}$ layer. As for the seed layer, Ta may be replaced with Nb, Ti, Hf or Zr, if desired. Also, ferromagnetic FeMn may be replaced with Ir—Mn or Pt—Mn by way of example.

A magnetic field of 100 Oe was continuously applied to the substrate 201 in one direction throughout the process described above. After the process, the entire laminate was subjected to heat treatment at 200° C. for 1 hour with a magnetic field of 500 Oe being applied to the substrate 201 in the above one direction.

After the step shown in FIG. 3D, the laminate was finely processed by photolithography so as to produce 2 μm square, MR devices.

FIG. 22 lists conditions particular to a first, a second and a third example (Ex.) of the illustrative embodiment and conditions particular to a first and a second comparative example (Comp. Ex.). As shown, in the first to third examples, the Al layer 207 was 1 nm thick. After the oxidation using oxygen of the ground level, the first, second and third examples effected oxidation for 3 minutes, 10 minutes and 15 minutes, respectively, by using oxygen excited by a 13.56 MHz high frequency wave. The first comparative example oxidized a 1 nm thick, aluminum layer with oxygen of the ground level at a pressure of 25 kPa for 20 minutes, thereby forming a tunnel barrier layer. The second comparative example oxidized a 1 nm thick aluminum layer with excited oxygen for 10 minutes, thereby forming a tunnel barrier layer.

In FIG. 22, "yield" refers to the ratio of the number of MR devices not deteriorated when applied with a voltage of 1 V to the total number of MR devices produced. In each of the first to third examples and each of the first and second comparative examples, fifty MR devices were produced and had their characteristics measured.

As FIG. 22 indicates, a standardized resistance available with the first to third examples is higher than the resistance of the first comparative example and increases with an increase in oxidizing time using excited oxygen. The second comparative example, which effected oxidation over the same period of time as the second example, had a higher junction resistance than the second example. This is because the second example first effected oxidation with oxygen of the ground level and therefore slowed down oxidation using oxygen of the excitation level.

The first to third examples each have a greater MR ratio than the first and second comparative examples. Further, the first to third examples and first comparative example attain a yield ranging from 98% to 100% while the yield achievable with the second comparative example is far lower than such a yield. This is presumably because the second comparative example caused oxidation to extend to the underlying fixed layer 206 and thereby lowered resistivity to voltage.

As stated above, the illustrative embodiment oxidizes aluminum with oxygen of the ground level and then oxidizes it with oxygen of the excitation level to thereby form a tunnel barrier layer. The resulting MR device has a high MR ratio and high resistivity to voltage.

The illustrative embodiment deposits metal or semiconductor on the fixed layer, which underlies the insulation layer or tunnel barrier layer, oxidizes the metal or the semiconductor with oxygen of the ground level, and then oxidizes it with oxygen of the excitation level. At the time when the metal or the semiconductor is oxidized by oxygen of the ground level, the metal or the semiconductor remains partly non-oxidized although the ferromagnetic material of the fixed layer is not oxidized. However, the following oxidation using oxygen of the excitation level drives oxidation inside of the insulation layer for thereby successfully oxidizing the non-oxidized part of the metal or that of the semiconductor.

Further, the oxidation using oxygen of the ground level oxidizes at least the surface of the metal or semiconductor layer. Therefore, the oxidation of the first-stage oxide layer using oxygen of the excitation level proceeds more slowly than the direct oxidation of the metal or semiconductor layer using oxygen of the excitation level and is easy control.

Moreover, the illustrative embodiment can prevent oxidation from extending to the underlying magnetic layer and can oxidize non-oxidized part of the metal or that of the semiconductor in the insulation layer. The resulting MR device achieves a high MR ratio and high reliability.

Figure 4A:
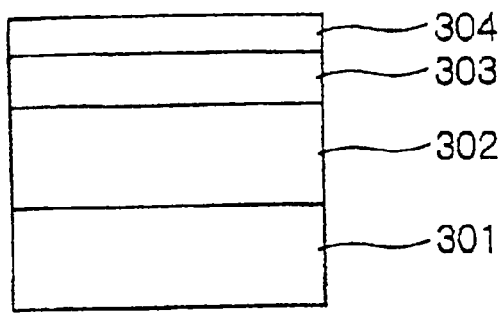
FIGS. 4A through 4F are views demonstrating a procedure for producing a second embodiment of the MR device in accordance with the present invention.

Reference will be made to FIGS. 4A through 4F for describing a second embodiment of the MR device in accordance with the present invention. First, as shown in FIG. 4A, an antiferromagnetic layer 302, a fixed layer 303 formed of a first ferromagnetic material and a first metal or semiconductor layer 304 are sequentially formed on an insulative substrate 301.

Figure 4B:
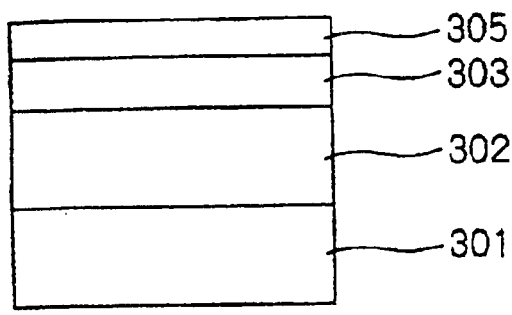
Figure 4C:
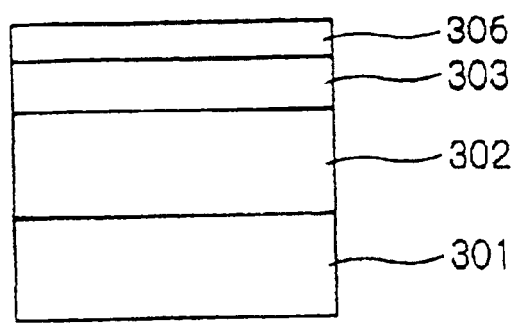
Figure 4D:
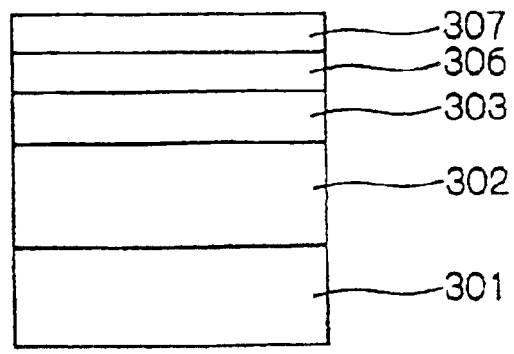
Figure 4E:
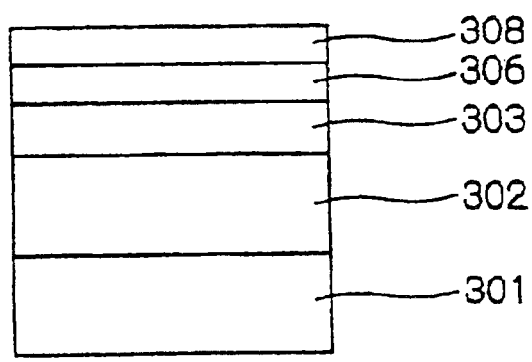
Figure 4F:
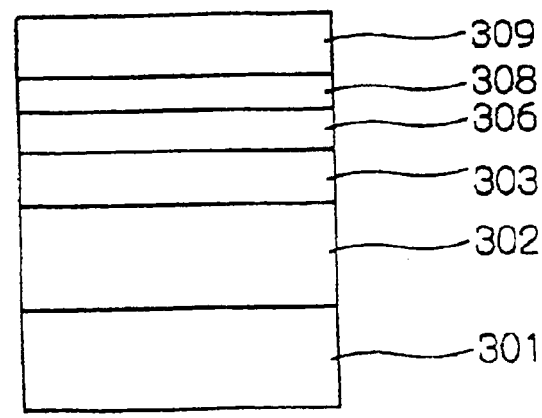

As shown in FIG. 4B, the first metal or semiconductor layer 301 is oxidized by oxygen of the ground level to become a first-stage first oxide layer 305. As shown in FIG. 4C, oxygen of the excitation level is fed to the surface of the first-stage first oxide layer 305 to thereby transform the layer 305 to a second-stage first oxide layer 306. Subsequently, as shown in FIG. 4D, a second metal or semiconductor layer 307 is formed on the second-stage first oxide layer 306. As shown in FIG. 4E, the second metal or semiconductor layer 307 is oxidized by oxygen of the excitation level to become a second oxide layer 308. Finally, as shown in FIG. 4F, a free layer 309 constituted by a second ferromagnetic material is formed on the second oxide layer 308.

Again, for the first and second ferromagnetic materials, use maybe made of any one of Fe, Co, Ni, alloys thereof, NiMnSb and other conventional ferromagnetic materials. Further, each ferromagnetic material may even be a laminate of such ferromagnetic materials. The antiferromagnetic layer 302 may be implemented by Fe—Mn, Ir—Mn, Pt—Mn, Ni—Mn, Pd—Mn or similar alloy. For the first and second metal or semiconductor layers 304 and 307, use may be made of an element highly insulative and able to form a nonmagnetic oxide, e.g., silicon, germanium or similar semiconductor, aluminum, magnesium yttrium, lanthanoids or similar metal.

Figure 5A:
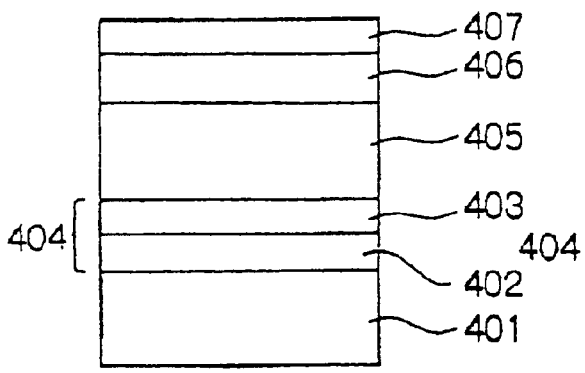
FIGS. 5A through 5F are view showing an example of the second embodiment.

A specific example of the second embodiment will be described with reference to FIGS. 5A through 5F. As shown in FIG. 5A, a Si substrate 401 had its surface thermally oxidized. A buffer layer 404, a 10 nm thick, antiferromagnetic layer 405, a 2.5 nm thick, fixed layer 406 and a 1.0 nm thick, first Al layer 407 were sequentially formed on the Si substrate 401 by sputtering in the same vacuum. The buffer layer 404 was made up of a 5 nm thick, Ta layer 402 and a 5 nm thick, $Ni_{0.81}Fe_{0.19}$ layer 403. The antiferromagnetic layer 405 and fixed layer 406 were formed of FeMn and CoFe, respectively.

Figure 5D:
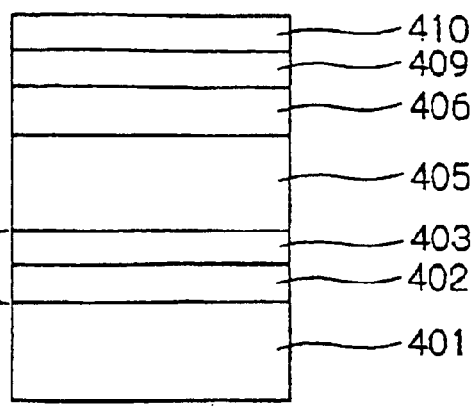
Figure 5B:
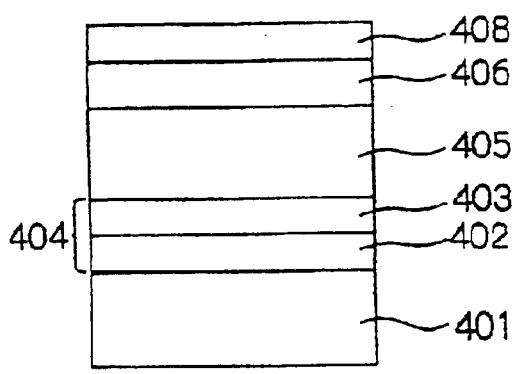

As shown in FIG. 5B, the first Al layer 407 was oxidized by oxygen to become a first-stage first aluminum oxide layer 408. For this purpose, oxygen gas of the ground level was sent into a sputtering chamber up to a pressure of 25 kPa, and then the laminate was held in the sputtering chamber for 20 minutes.

Figure 5E:
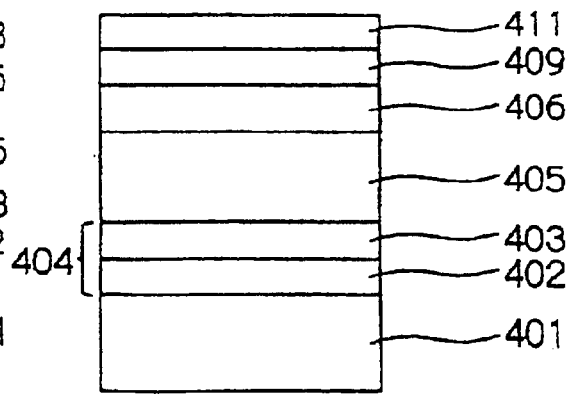
Figure 5C:
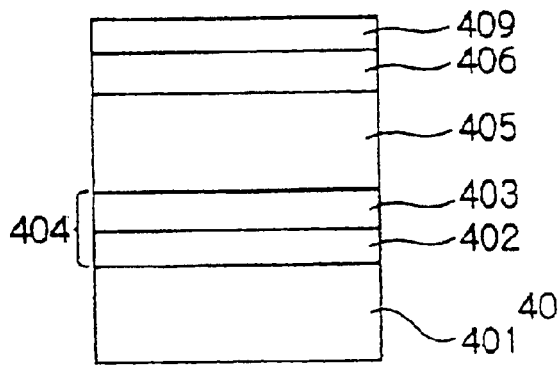

As shown in FIG. 5C, after the sputtering chamber had been exhausted, oxygen excited by a 13.56 MHz high frequency wave was send into the sputtering chamber for 3 minutes. As a result, the first-stage first aluminum oxide layer 408 was transformed to a second-stage first aluminum oxide layer 409. Subsequently, as shown in FIG. 5D, after the sputtering chamber had been exhausted to the background level, a 1.0 nm thick, second Al layer 410 was formed on the second-stage first aluminum oxide layer 409.

Figure 5F:
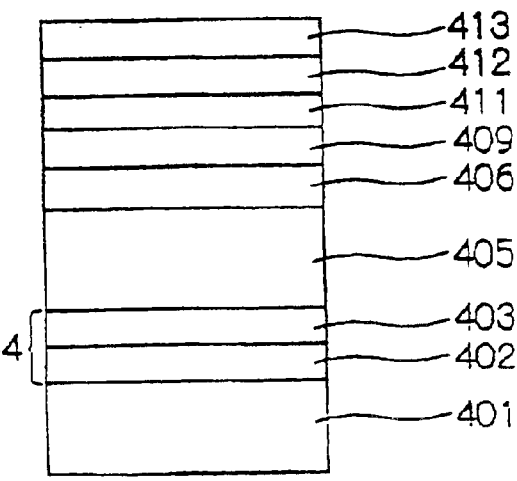

Thereafter, as shown in FIG. 5E, oxygen excited by a 13.56 MHz high frequency wave was sent into the sputtering chamber for 15 minutes to thereby transform the second Al layer 410 to a second aluminum oxide layer 411. As shown in FIG. 5F, a 10 nm thick, $Ni_{0.81}Fe_{0.19}$ free layer 412 was formed on the second aluminum oxide layer 411. Finally, a 5 nm thick, Ta layer 413 was formed on the free layer 412 for protecting the surface of the laminate.

Again, the buffer layer 44 allows antiferromagnetic FeMn with a face-centered γ phase to grow. The $Ni_{0.81}Fe_{0.19}$ layer 403 should therefore have (111) orientation. The Ta layer 402 plays the role of a seed layer for controlling the orientation of the $Ni_{0.81}Fe_{0.19}$ layer 403. As for the seed layer, Ta may be replaced with Nb, Ti, Hf or Zr, if desired. Also, ferromagnetic FeMn may be replaced with Ir—Mn or Pt—Mn by way of example.

A magnetic field of 100 Oe was continuously applied to the substrate 401 in one direction throughout the process described above. After the process, the entire laminate was subjected to heat treatment at 200° C. for 1 hour with a magnetic field of 500 Oe being applied to the substrate 201 in the above one direction.

After the step shown in FIG. 4F, the laminate was finely processed by photolithography so as to produce 2 μm square, MR devices.

Measurement showed that a specific example of the illustrative embodiment achieved a junction resistance of 19.3 MΩ·m², an MR ratio of 42%, and a yield of 96%. The measurement therefore proved that the MR device of the illustrative embodiment had a high MR ratio and high resistivity to voltage.

Figure 6A:
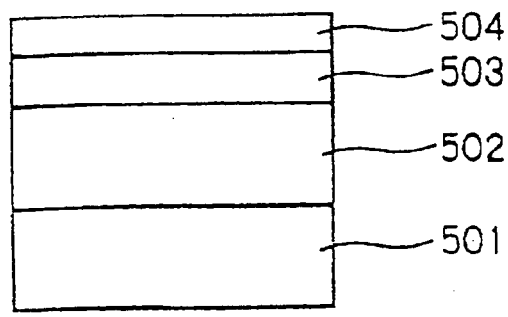
FIGS. 6A through 6E are views demonstrating a procedure for producing a third embodiment of the MR device in accordance with the present invention.
Figure 6D:
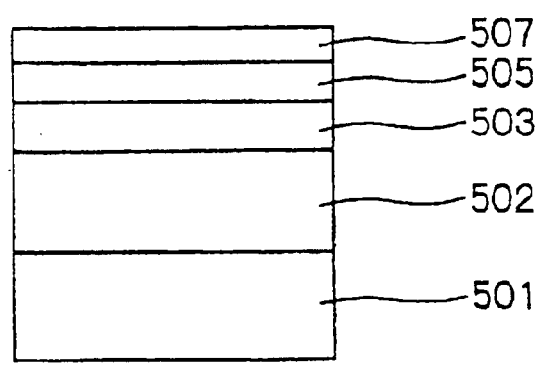
Figure 6B:
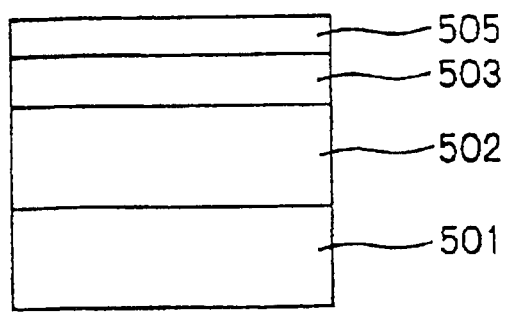

FIGS. 6A through 6E show a third embodiment of the present invention. First, as shown in FIG. 6A, an antiferromagnetic layer 502, a fixed layer 503 implemented by a first ferromagnetic material and a first metal or semiconductor layer 504 are formed on an insulative substrate 501. As shown in FIG. 6B, the first metal or semiconductor layer 504 is oxidized by oxygen of the ground level to become a first oxide layer 505.

Figure 6E:
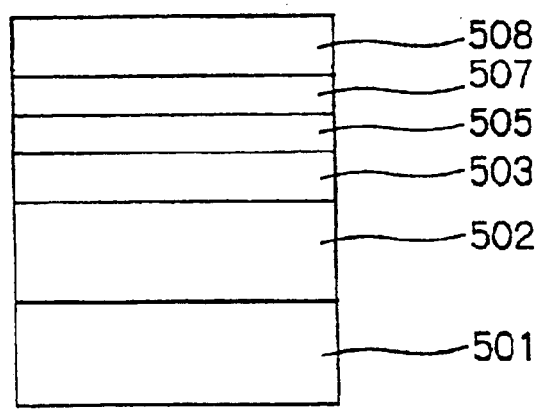
Figure 6C:
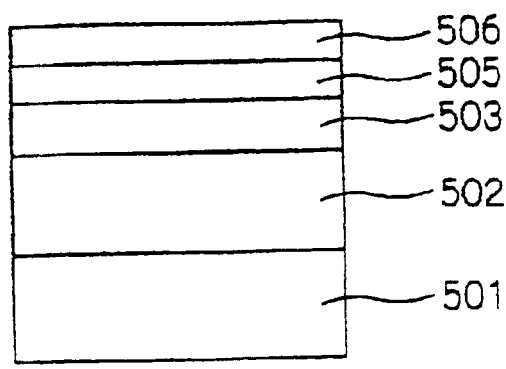

As shown in FIG. 6C, a second metal or semiconductor layer 506 is formed on the first oxide layer 505. As shown in FIG. 6D, oxygen of the excitation level is fed to the surface of the second metal or semiconductor layer to thereby transform the layer 506 to a second oxide layer 507. Finally, as shown in FIG. 6E, a free layer 508 implemented by a second ferromagnetic material is formed on the second oxide layer 507.

Again, for the first and second ferromagnetic materials, use may be made of any one of Fe, Co, Ni, alloys thereof, NiMnSb and other conventional ferromagnetic materials. Further, each ferromagnetic material may even be a laminate of such ferromagnetic materials. The antiferromagnetic layer 502 may be implemented by Fe—Mn, Ir—Mn, Pt—Mn, Ni—Mn, Pd—Mn or similar alloy. For the first and second metal or semiconductor layers 504 and 506, use may be made of an element highly insulative and able to form a nonmagnetic oxide, e.g., silicon, germanium or similar semiconductor, aluminum, magnesium yttrium, lanthanoids or similar metal.

Figure 7A:
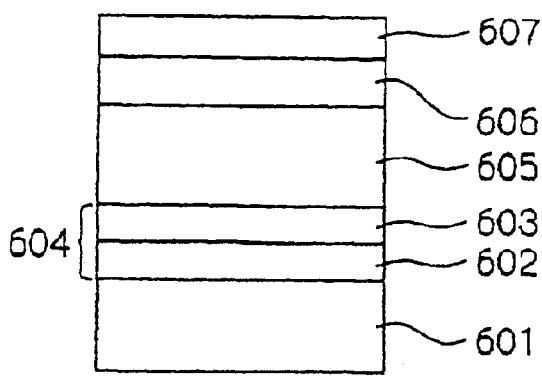
FIGS. 7A through 7E are views showing an example of the third embodiment.

FIGS. 7A through 7E show a specific example of the illustrative embodiment. As shown in FIG. 7A, a Si substrate 401 had its surface thermally oxidized. A buffer layer 604, a 10 nm thick, antiferromagnetic layer 605, a 2.5 nm thick, fixed layer 606 and a first Al layer 607 were sequentially formed on the Si substrate 601 by sputtering in the same vacuum. The buffer layer 604 was made up of a 5 nm thick, Ta layer 602 and a 5 nm thick, $Ni_{0.81}Fe_{0.19}$ layer 603. The antiferromagnetic layer 605 and fixed layer 606 were formed of FeMn and CoFe, respectively. The background pressure before film forming was $1\times10^{-5}$ Pa or below while the Ar pressure during sputtering was 0.7 Pa.

Figure 7D:
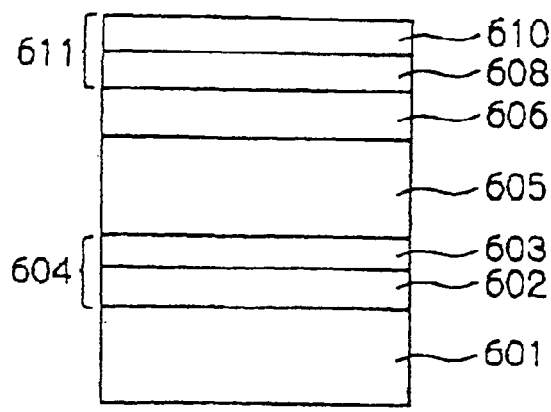
Figure 7B:
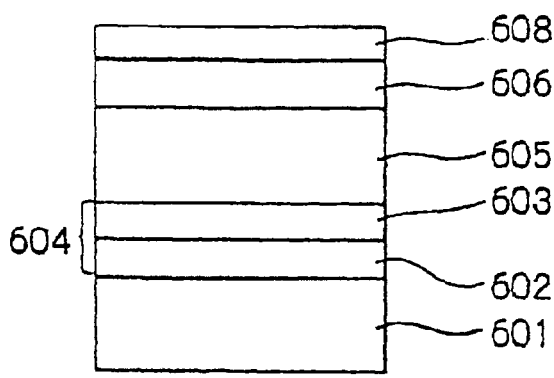

As shown in FIG. 7B, the first Al layer 607 was oxidized by oxygen to become a first aluminum oxide layer 608. For this purpose, oxygen gas of the ground level was sent into a sputtering chamber up to a pressure of 25 kPa, and then the laminate was held in the sputtering chamber for 20 minutes.

Figure 7E:
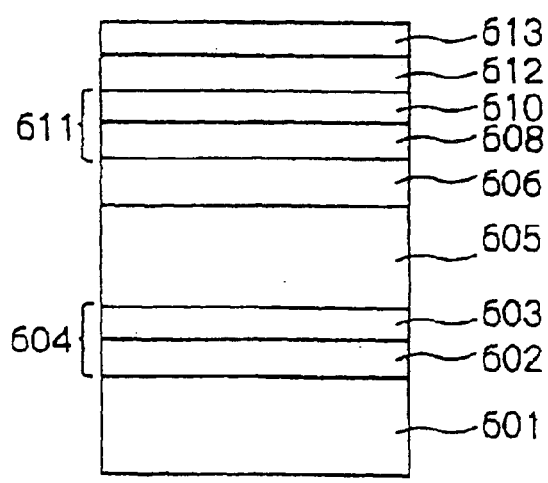
Figure 7C:
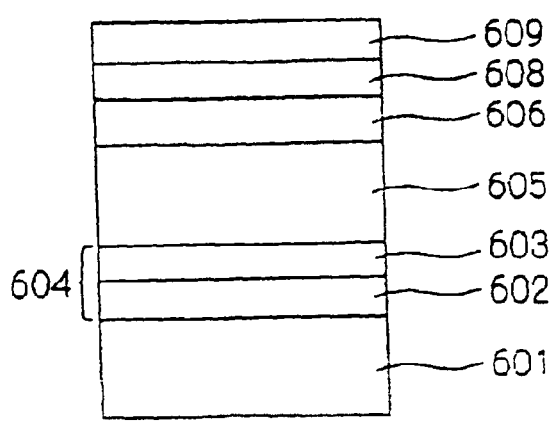

As shown in FIG. 7C, after the sputtering chamber had been exhausted to the ground pressure, a second Al layer 609 was formed on the first aluminum oxide layer 608. Thereafter, as shown in FIG. 7D, oxygen of the excitation level was fed to the surface of the second Al layer 609 to thereby transform the layer 609 to a second aluminum oxide layer 610. The first and second aluminum oxide layers constituted a tunnel barrier layer 611. As shown in FIG. 7E, after the sputtering chamber had been exhausted to the background pressure, a 10 nm thick, $Ni_{0.81}Fe_{0.19}$ free layer 612 was formed on the tunnel barrier layer 611. Finally, a 5 nm thick, Ta layer 613 was formed on the free layer 612 for protecting the surface of the laminate.

The buffer layer 604 allows antiferromagnetic FeMn with a face-centered γ phase to grow. The $Ni_{0.81}Fe_{0.19}$ layer 603 should therefore have (111) orientation. The Ta layer 602 plays the role of a seed layer for controlling the orientation of the $Ni_{0.81}Fe_{0.19}$ layer 603. As for the seed layer, Ta maybe replaced with Nb, Ti, Hf or Zr, if desired. Also, ferromagnetic FeMn may be replaced with Ir—Mn or Pt—Mn by way of example.

A magnetic field of 100 Oe was continuously applied to the substrate 601 in one direction throughout the process described above. After the process, the entire laminate was subjected to heat treatment at 200° C. for 1 hour with a magnetic field of 500 Oe being applied to the substrate 601 in the above one direction.

After the step shown in FIG. 7E, the laminate was finely processed by photolithography so as to produce 2 μm square, MR devices.

FIG. 23 lists the characteristics of a fifth, a sixth and a seventh example of the illustrative embodiment determined by measurement together with the characteristics of a third and a fourth comparative example. In the fifth to seventh examples and third and fourth comparative examples, a 13.56 MHz high frequency wave was used for exciting oxygen. In the eighth embodiment, ozone produced by the silent discharge of oxygen was fed to the vicinity of the substrate at the rate of 10 cm³ for a minute.

In the fifth and sixth examples, the first Al layers 607 were 0.4 nm thick and 1 nm thick, respectively; the second Al layers 609 were 1 nm thick each. Further, in the fifth and sixth examples, excited oxygen was used to oxidize the second Al layers 609 for 15 minutes. In the seventh example, the first and second Al layers 607 and 609 were 1.5 nm thick and 0.5 nm thick, respectively while the second Al layer 609 was oxidized by excited oxygen for 15 minutes. In the eighth example, the first and second Al layers 607 and 609 were 1 nm thick each while the second Al layer 609 was oxidized by ozone for 30 minutes.

In the third comparative example, the first and second Al layers 607 and 609 were 0.3 nm thick and 1 nm thick, respectively; the second Al layer 607 was oxidized by oxygen of the excitation level for 15 minutes. In the fourth comparative example, a 1.4 nm thick Al layer was oxidized by oxygen of the excitation level for 15 minutes for thereby forming an insulation layer or tunnel barrier layer.

The fifth to eighth embodiments each achieved an MR ratio of 38% or above higher than the MR ratios of the third and fourth comparative examples. Also, the third and fourth comparative examples showed a yield of about 40% to about 50% while the fifth to eighth realized a substantially 100% yield. As for the low MR ratio and low yield of the third comparative example, the first Al layer 607 was presumably too thin to cover the entire surface of the underlying fixed layer 606, so that oxygen of the ground level and oxygen of the excitation level oxidized the surface of the fixed layer 606. In the case of the fourth comparative example, oxygen of the excitation level oxidized not only aluminum but also the fixed layer 606.

The fact that the fifth example implements a high MR ratio and a high yield indicates that the first Al layer 607 can cover the entire surface of the fixed layer 606 if it is at least 0.4 nm thick.

As stated above, to form the insulation layer or tunnel barrier layer, the illustrative embodiment deposits metal or semiconductor on the underlying fixed layer, oxidizes the metal or the semiconductor with oxygen of the ground level, again deposits metal or semiconductor, and then oxidizes it with oxygen of the excitation level. When oxygen of the excitation level oxidizes the metal or the semiconductor, oxidation extends to the insulation layer oxidized by oxygen of the ground level. This successfully oxidizes the non-oxidized interface between the insulation layer and the fixed layer.

Further, the oxidation of the insulation layer proceeds more slowly than the direct oxidation of metal or semiconductor and is therefore easy to control. Moreover, metal or semiconductor is deposited at least twice during the formation of the insulation layer. The second deposition is expected to cover pin holes or similar defects that may appear during the first deposition.

Figure 8A:
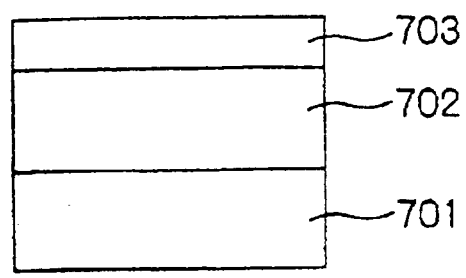
FIGS. 8A through 8D are views demonstrating a procedure for producing a fourth embodiment of the MR device in accordance with the present invention.
Figure 8C:
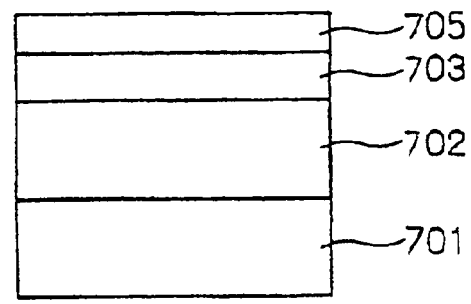
Figure 8B:
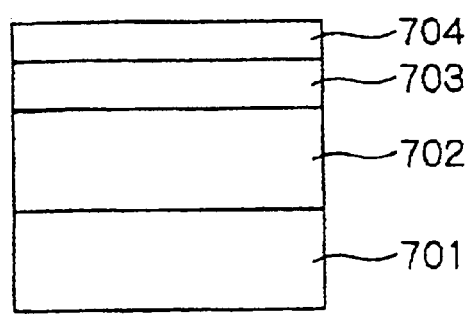
Figure 8D:
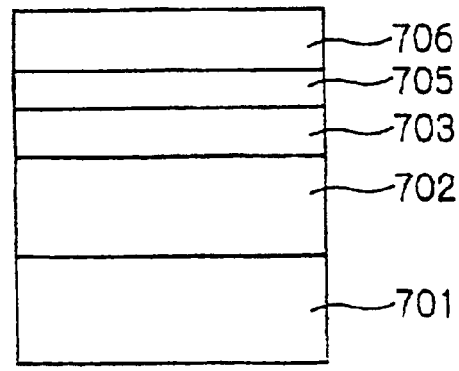

FIGS. 8A through 8D show a fourth embodiment of the present invention. First, as shown in FIG. 8A, an antiferromagnetic layer 702 and a fixed layer 703 implemented by a first ferromagnetic material are formed on an insulative substrate 701. As shown in FIG. 8B, an oxide layer 704 is formed on the fixed layer 703 by using an oxide as a material. As shown in FIG. 8C, oxygen of the excitation level is fed to the surface of the oxide layer 704 to thereby transform the layer 704 to a second-stage oxide layer 705. Finally, as shown in FIG. 8D, a free layer 706 implemented by a second ferromagnetic material is formed on the second-stage oxide layer 705.

Again, the first and second ferromagnetic materials maybe implemented by any one of Fe, Co, Ni, alloys thereof, NiMnSb and other conventional materials. The first and second ferromagnetic materials each may even be implemented as a laminate of such ferromagnetic materials. For the antiferromagnetic layer 702, use may be made of, e.g., Fe—Mn, Ir—Mn, Pt—Mn, Ni—Mn, Pd—Mn or an alloy thereof.

Figure 9A:
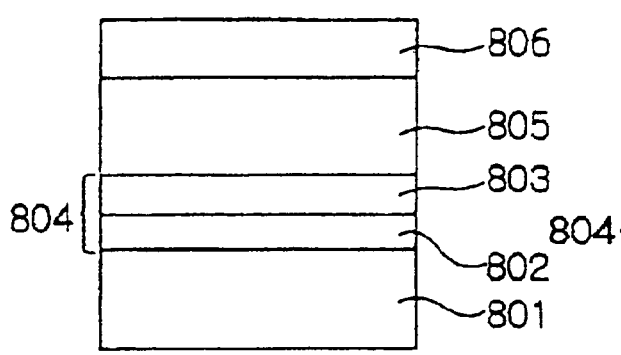
FIGS. 9A through 9D are views showing an example of the fourth embodiment.

FIGS. 9A through 9D shows an example of the illustrative embodiment. First, as shown in FIG. 9A, a Si substrate 801 had its surface thermally oxidized. A buffer layer 804, a 10 nm thick, antiferromagnetic layer 805 and a 2.5 nm thick, fixed layer 806 were sequentially formed on the Si substrate 801 by sputtering. The buffer layer 804 was made up of a 5 nm thick, Ta layer 802 and a 5 nm thick, $Ni_{0.81}Fe_{0.19}$ layer 803. The antiferromagnetic layer 805 and fixed layer 806 were formed of FeMn and CoFe, respectively.

Figure 9C:
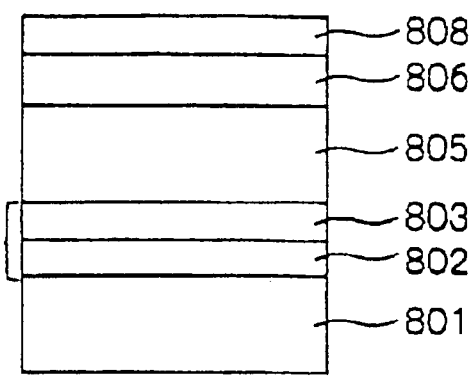
Figure 9B:
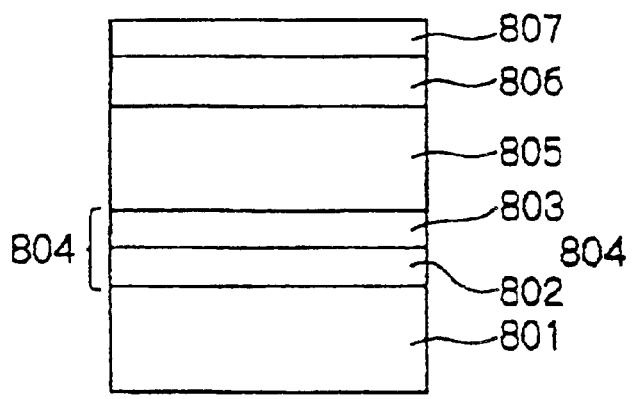
Figure 9D:
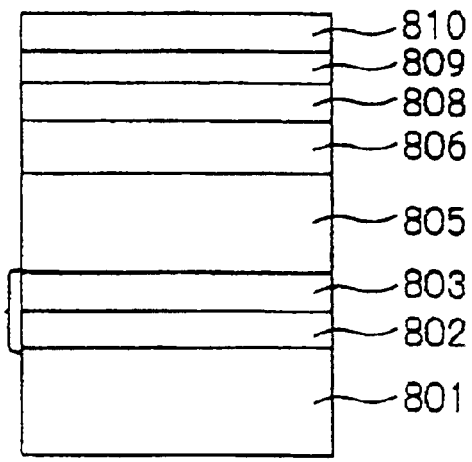

As shown in FIG. 9B, after a film forming device had been exhausted, a first-stage aluminum oxide layer 807 implemented by aluminum oxide was formed on the fixed layer 806 by EB (Electron Beam) deposition. As shown in FIG. 9C, oxygen excited by a 13.56 MHz high frequency wave was fed to the surface of the oxide layer 807 to thereby transform the layer 807 to a second-stage aluminum oxide layer 808. Subsequently, as shown in FIG. 9D, after the film forming device had been exhausted, a 10 nm thick, $Ni_{0.81}Fe_{0.19}$ free layer 809 was formed on the oxide layer 808. Finally, a 5 nm thick, Ta layer 810 was formed on the free layer 809 for the protection purpose.

The buffer layer 804 allows antiferromagnetic FeMn with a face-centered γ phase to grow. The $Ni_{0.81}Fe_{0.19}$ layer 803 should therefore have (111) orientation. The Ta layer 802 plays the role of a seed layer for controlling the orientation of the $Ni_{0.81}Fe_{0.19}$ layer 803. As for the seed layer, Ta maybe replaced with Nb, Ti, Hf or Zr, if desired. Also, ferromagnetic FeMn may be replaced with Ir—Mn or Pt—Mn by way of example.

A magnetic field of 100 Oe was continuously applied to the substrate 801 in one direction throughout the process described above. After the process, the entire laminate was subjected to heat treatment at 200° C. for 1 hour with a magnetic field of 500 Oe being applied to the substrate 801 in the above one direction.

After the step shown in FIG. 9D, the laminate was finely processed by photolithography so as to produce 2 μm square, MR devices.

FIG. 24 lists the characteristics of an example of the illustrative embodiment, i.e., a ninth example together with the characteristics of a fifth comparative example.

In the ninth example, a 1 nm thick, aluminum oxide film was formed on the fixed layer 806 as a tunnel barrier layer, and then excited oxygen was fed to the surface of the tunnel barrier layer for 10 minutes. In the fifth comparative example, a 1 nm thick, aluminum oxide layer or tunnel barrier layer was also formed, but was not oxidized.

As FIG. 24 indicates, the fifth comparative example is lower in both of junction resistance and MR ratio than the ninth example. This is presumably because the fifth comparative example formed the tunnel barrier layer by evaporating aluminum oxide at a high vacuum level and therefore brought about the loss of oxygen. By contrast, the ninth embodiment is considered to be free from the loss of oxygen.

As stated above, to form the insulation layer or tunnel barrier layer, the illustrative embodiment directly deposits an oxide on the underlying fixed layer and then oxidizes the oxide with oxygen of the excitation level. This prevents oxidation from extending to the underlying magnetic material and prevents the metal or the semiconductor from remaining at the interface non-oxidized.

Further, the illustrative embodiment oxidizes the oxide on the fixed layer with oxygen of the excitation level for thereby obviating the loss of oxygen. Moreover, the illustrative embodiment deposits the oxide of metal or that of semiconductor and then oxidizes it. The oxidation therefore proceeds more slowly than the oxidation of metal or semiconductor effected with oxygen of the excitation level and is easy to control.

Figure 10A:
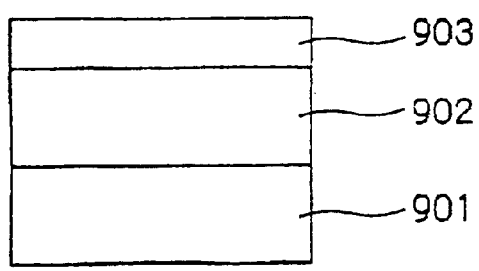
FIGS. 10A through 10F are views demonstrating a procedure for producing a fifth embodiment of the MR device in accordance with the present invention.
Figure 10D:
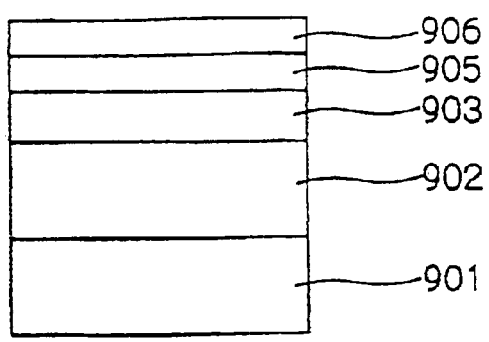
Figure 10B:
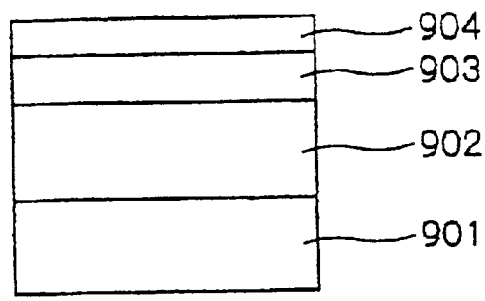
Figure 10E:
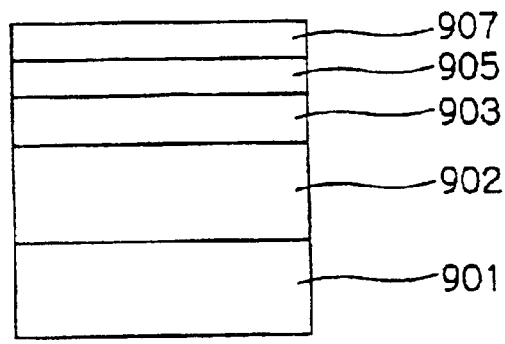
Figure 10C:
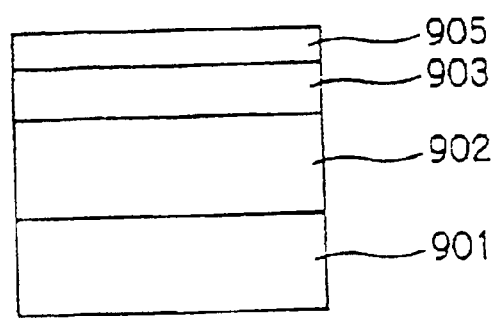
Figure 10F:
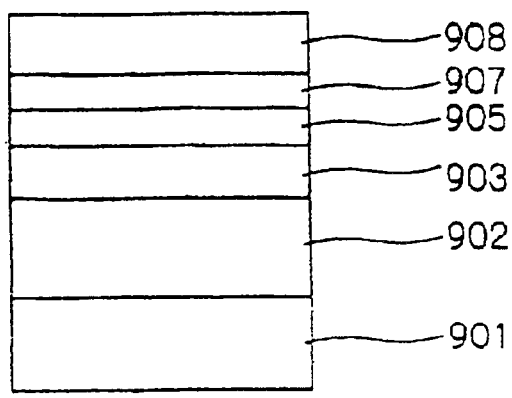

Reference will be made to FIGS. 10A through 10F for describing a fifth embodiment of the present invention. First, as shown in FIG. 10A, an antiferromagnetic layer 902 and a fixed layer 903 implemented by a first ferromagnetic material are sequentially formed on an insulative substrate 901. As shown in FIG. 10B, a first oxide layer 904 is formed on the fixed layer 903 by using an oxide as a material. As shown in FIG. 10C, oxygen of the excitation level is fed to the surface of the firs oxide layer 904 to thereby transform the layer 904 to a second-stage first oxide layer 905. As shown in FIG. 10D, a metal or semiconductor layer 906 is formed on the second-stage first oxide layer 905. As shown in FIG. 10E, oxygen of the excitation level is fed to the surface of the metal or semiconductor layer 906 to thereby transform the layer 906 to a second oxide layer 907. Finally, a free layer 908 implemented by a second ferromagnetic layer is formed on the second oxide layer 907.

Again, the first and second ferromagnetic materials maybe implemented by any one of Fe, Co, Ni, alloys thereof, NiMnSb and other conventional materials. The first and second ferromagnetic materials each may even be implemented as a laminate of such ferromagnetic materials. For the antiferromagnetic layer 902, use may be made of, e.g., Fe—Mn, Ir—Mn, Pt—Mn, Ni—Mn, Pd—Mn or an alloy thereof.

Figure 11A:
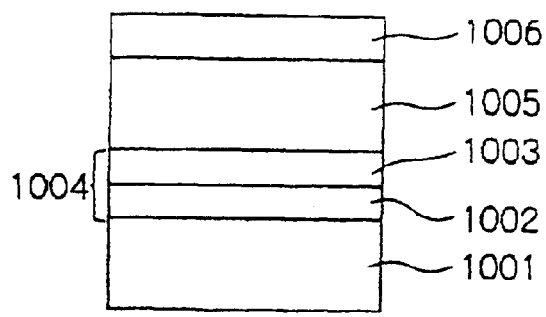
FIGS. 11A through 11F are views showing an example of the fifth embodiment.

FIGS. 11A through 11F show an example of the illustrative embodiment. First, as shown in FIG. 11A, a Si substrate 1001 had its surface thermally oxidized. A buffer layer 1004, a 10 nm thick, antiferromagnetic layer 1005 and a 2.5 nm thick, fixed layer 1006 were sequentially formed on the Si substrate 1001 by sputtering. The buffer layer 1004 was made up of a 5 nm thick, Ta layer 1002 and a 5 nm thick, $Ni_{0.81}Fe_{0.19}$ layer 1003. The antiferromagnetic layer 1005 and fixed layer 1006 were formed of FeMn and CoFe, respectively.

Figure 11D:
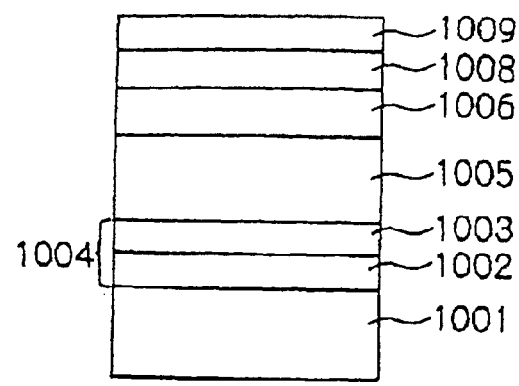
Figure 11B:
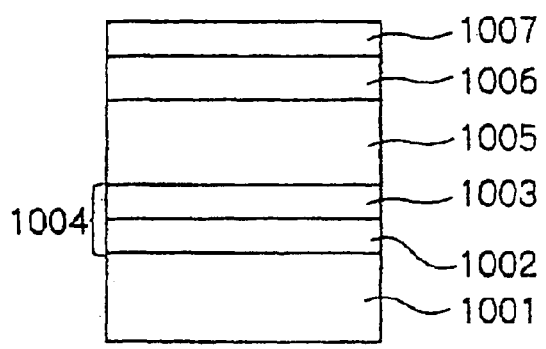
Figure 11E:
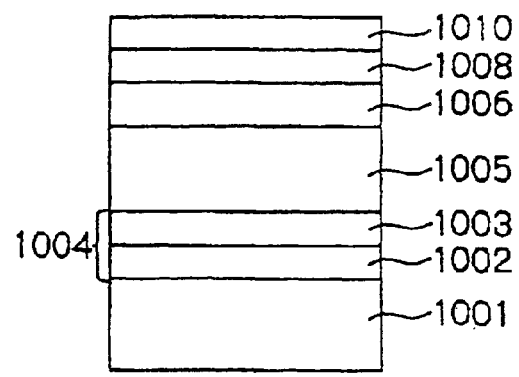
Figure 11C:
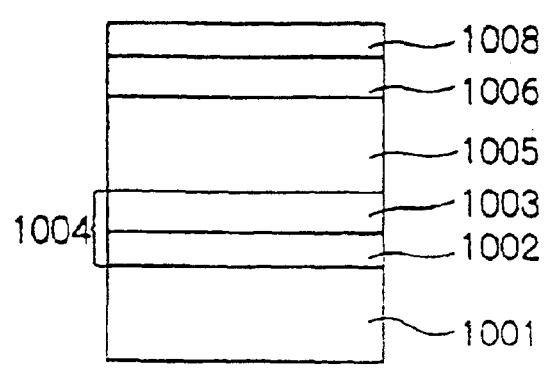

As shown in FIG. 11B, after a film forming device had been exhausted, a first aluminum oxide layer 1007 was formed on the fixed layer 1006 by EB deposition by using aluminum oxide as a material. As shown in FIG. 11C, oxygen excited by a 13.56 MHz high frequency wave was fed to the surface of the first aluminum oxide layer 1007 to thereby transform the layer 1007 to a second-stage first aluminum oxide layer 1008.

Figure 11F:
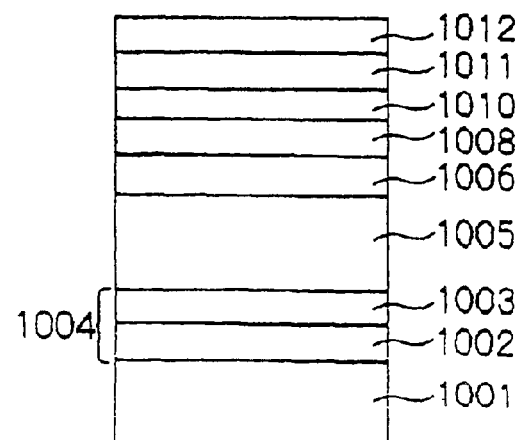

As shown in FIG. 11D, an Al layer 1009 was formed on the second-stage first aluminum oxide layer 1008 by sputtering. As shown in FIG. 11E, oxygen excited by a 13.56 MHz high frequency wave was fed to the surface of the Al layer 1009 for thereby forming a second aluminum layer 1010. As shown in FIG. 11F, a 10 nm thick, $Ni_{0.81}Fe_{0.19}$ free layer 1011 was formed on the second aluminum oxide layer 1010. Finally, a 5 nm thick, Ta layer 1012 was formed on the free layer 1011 for a protection purpose.

The buffer layer 1004 allows antiferromagnetic FeMn with a face-centered γ phase to grow. The $Ni_{0.81}Fe_{0.19}$ layer 1003 should therefore have (111) orientation. The Ta layer 1002 plays the role of a seed layer for controlling the orientation of the $Ni_{0.81}Fe_{0.19}$ layer 1003. As for the seed layer, Ta may be replaced with Nb, Ti, Hf or Zr, if desired. Also, ferromagnetic FeMn may be replaced with Ir—Mn or Pt—Mn by way of example.

A magnetic field of 100 Oe was continuously applied to the substrate 1001 in one direction throughout the process described above. After the process, the entire laminate was subjected to heat treatment at 200° C. for 1 hour with a magnetic field of 500 Oe being applied to the substrate 1001 in the above one direction.

After the step shown in FIG. 11D, the laminate was finely processed by photolithography so as to produce 2 μm square, MR devices.

The characteristics of the above example (tenth example) were measured under the following conditions. The first aluminum oxide layer was 1 nm thick and oxidized for 10 minutes. The Al layer 1009 was 0.5 nm thick and oxidized for 10 minutes. The tenth example had a junction resistance of 14.0 $MΩ.μm^2$, an MR ratio of 43%, and a yield of 98%.

This proves that the fifth embodiment insures a high MR ratio and high resistance to voltage.

Figure 12A:
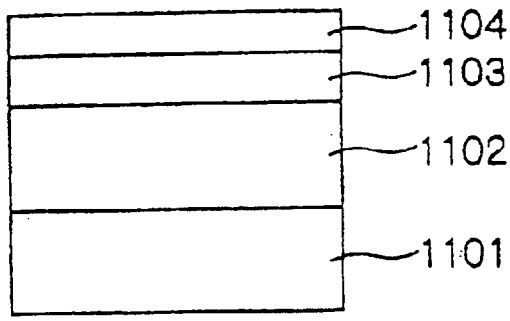
FIGS. 12A through 12D are views demonstrating a procedure for producing a sixth embodiment of the MR device in accordance with the present invention.

Referring to FIGS. 12A through 12D, a sixth embodiment of the present invention will be described. First, as shown in FIG. 12A, an antiferromagnetic layer 1102 and a fixed layer 1103 implemented by a first ferromagnetic material are sequentially formed on an insulative substrate 1101. A first oxide layer 1104 is formed on the fixed layer 1103 by using an oxide of metal or that of semiconductor as a material.

Figure 12C:
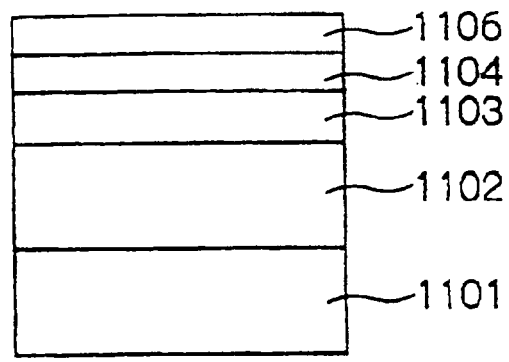
Figure 12B:
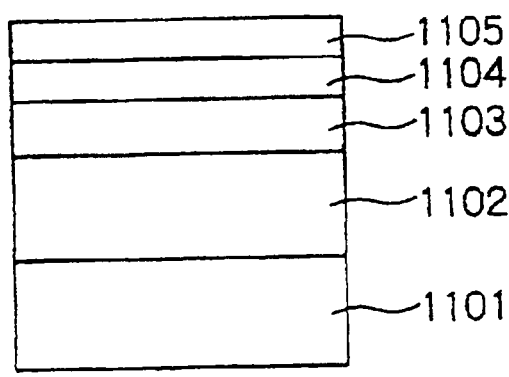
Figure 12D:
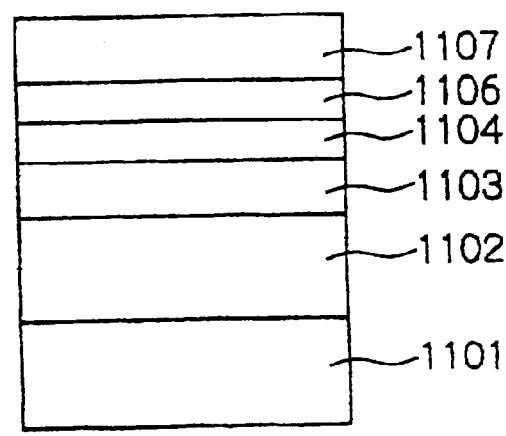

As shown in FIG. 12B, a metal or semiconductor layer 1105 is formed on the first oxide layer 1104. As shown in FIG. 12C, oxygen of the excitation level is fed to the surface of the metal or semiconductor layer 1105 to thereby transform the layer 1105 to a second oxide layer 1106. Finally, as shown in FIG. 12D, a free layer 1107 implemented by a second ferromagnetic material is formed on the second oxide layer 1106.

Again, the first and second ferromagnetic materials maybe implemented by any one of Fe, Co, Ni, alloys thereof, NiMnSb and other conventional materials. The first and second ferromagnetic materials each may even be implemented as a laminate of such ferromagnetic materials. For the antiferromagnetic layer 1102, use may be made of, e.g., Fe—Mn, Ir—Mn, Pt—Mn, Ni—Mn, Pd—Mn or an alloy thereof.

For the metal or semiconductor layer 1105, use may be made of an element highly insulative and able to form a nonmagnetic oxide, e.g., silicon, germanium or similar semiconductor, aluminum, magnesium yttrium, lanthanoids or similar metal.

Figure 13A:
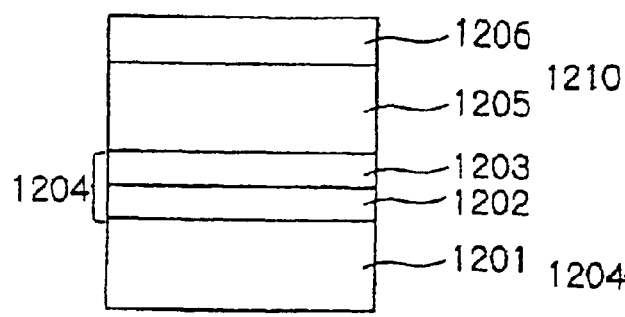
FIGS. 13A through 13E are views showing an example of the sixth embodiment.

FIGS. 13A through 13E show an example of the illustrative embodiment. First, as shown in FIG. 13A, a Si substrate 1201 had its surface thermally oxidized. A buffer layer 1204, a 10 nm thick, antiferromagnetic layer 1205 and a 2.5 nm thick, fixed layer 1206 were sequentially formed on the Si substrate 1201 by sputtering in the same vacuum. The buffer layer 1204 was made up of a 5 nm thick, Ta layer 1202 and a 5 nm thick, $Ni_{0.81}Fe_{0.19}$ layer 1203. The antiferromagnetic layer 1205 and fixed layer 1206 were formed of FeMn and CoFe, respectively.

Figure 13D:
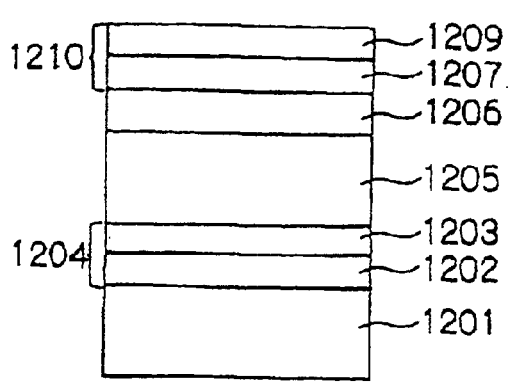
Figure 13B:
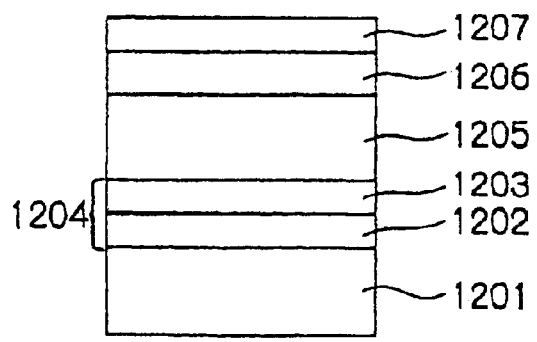
Figure 13E:
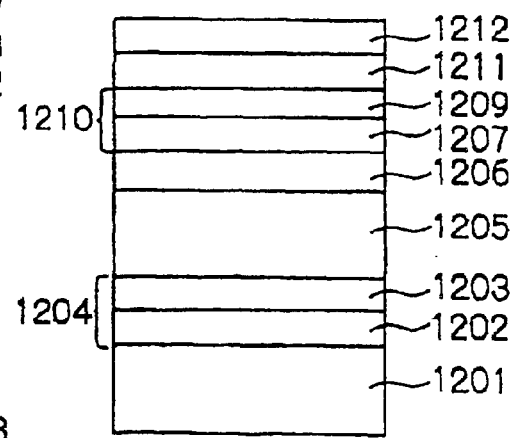
Figure 13C:
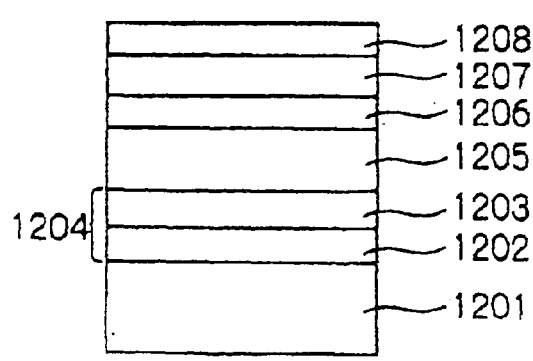

As shown in FIG. 13B, a first aluminum oxide layer 1207 was formed on the fixed layer 1206 by EB deposition by using aluminum oxide as a material. As shown in FIG. 13C, an Al layer 1208 was formed on the first aluminum oxide layer 1207 by sputtering. As shown in FIG. 13D, oxygen excited by a 13.56 MHz high frequency wave was fed to the surface of the Al layer 1208. As a result, the first aluminum oxide layer 1207 and second aluminum oxide layer 1209 formed a tunnel barrier layer 1210. Subsequently, as shown in FIG. 13E, after a film forming device had been exhausted, a 10 nm thick, $Ni_{0.81}Fe_{0.19}$ free layer 1211 was formed on the second aluminum oxide layer 1209. Finally, a 5 nm thick, Ta layer 1212 was formed on the free layer 1211 for a protection purpose.

The buffer layer 1204 allows antiferromagnetic FeMn with a face-centered γ phase to grow. The $Ni_{0.81}Fe_{0.19}$ layer 1203 should therefore have (111) orientation. The Ta layer 1202 plays the role of a seed layer for controlling the orientation of the $Ni_{0.81}Fe_{0.19}$ layer 1203. As for the seed layer, Ta may be replaced with Nb, Ti, Hf or Zr, if desired. Also, ferromagnetic FeMn may be replaced with Ir—Mn or Pt—Mn by way of example.

A magnetic field of 100 Oe was continuously applied to the substrate 1201 in one direction throughout the process described above. After the process, the entire laminate was subjected to heat treatment at 200° C. for 1 hour with a magnetic field of 500 Oe being applied to the substrate 1201 in the above one direction.

After the step shown in FIG. 13E, the laminate was finely processed by photolithography so as to produce 2 μm square, MR devices.

FIG. 25 compares an example of the illustrative embodiment, i.e., an eleventh example and a sixth comparative example. In the eleventh example, the first aluminum oxide layer 1207 formed by EB deposition was 0.7 nm thick while the Al layer was 0.4 nm thick. The oxidation of the Al layer 1208 effected with oxygen of the excitation level continued for 15 minute. In the sixth comparative example, the first aluminum oxide layer 1207 was 0.5 nm thick while the Al layer 1208 was 0.4 nm thick; the oxidization of the Al layer 1208 also continued for 15 minutes.

As FIG. 25 indicates, the eleventh example is superior to the sixth comparative example as to both of MR ratio and yield. This is presumably because in the sixth comparative example the first aluminum oxide layer 1207 was too thin to cover the entire surface of the underlying fixed layer 1206, causing the oxidation for forming the second aluminum layer 1209 to extend to the fixed layer 1206.

A twelfth example, which is another example of the illustrative embodiment, will be described hereinafter. The twelfth example differs from the eleventh example of FIGS. 13A through 13E in that a magnesium oxide layer was substituted for the first aluminum oxide layer 1207 and formed by EB deposition using magnesium oxide as a material. More specifically, the magnesium oxide layer was 0.5 nm thick while the Al layer formed on the magnesium oxide layer was 1.0 nm thick. The oxidation of the Al layer effected with oxygen of the excitation level continued for 15 minutes. The twelfth example achieved a junction resistance of 8.2 MΩ.μm², an MR ratio of 41%, and a yield of 98%. That is, by forming the magnesium oxide layer on the magnetic layer, it is possible to implement a high MR ratio and high resistivity to voltage.

As stated above, to form the insulation layer or tunnel barrier layer, the illustrative embodiment deposits an oxide on the underlying fixed layer, deposits a metal or a semiconductor, and then oxides the metal or the semiconductor with oxygen of the excitation level. This prevents the oxidation from extending to the underlying magnetic layer and prevents the metal or the semiconductor from remaining at the interface non-oxidized. These advantages are not achievable with a procedure that forms a metal or semiconductor layer and then executes oxidation.

Further, the oxidation of the metal or the semiconductor effected with oxygen of the excitation level extends to the oxide deposited on the fixed layer, obviating the loss of oxygen. In addition, the oxidation of the insulation layer proceeds more slowly than the oxidation of metal of semiconductor and is therefore easy to control.

A seventh embodiment of the illustrative embodiment will be described hereinafter. The seventh embodiment is identical with the fourth embodiment except that the oxide used as the material of the oxide layer 704, FIG. 8B, is replaced with a metal or semiconductor film resulting from reaction. More specifically, in the seventh embodiment, a metal or a semiconductor is subjected to evaporation or sputtering in an oxidizing atmosphere to thereby deposit an oxide.

In an example, or thirteenth example, of the seventh embodiment, aluminum was subjected to reactive evaporation in an oxidizing atmosphere for depositing aluminum oxide on the fixed layer 806. As for the rest of the procedure, the thirteenth example is identical with the ninth example. As for reactive evaporation, an oxidizing atmosphere should preferably surround only a substrate in order to protect an evaporation source from deterioration. In light of this, the thirteenth example sends oxygen to the vicinity of the substrate at a rate of 5 cm³ for a minute. The thirteenth example, like the ninth example, achieved a junction resistance of 1.4 MΩ.μm² and an MR ratio of 40%. Further, the thirteenth embodiment implemented a yield of 100%. This proves that the advantages of the ninth example are also achievable with the thirteenth example.

It is to be noted that even the fifth and sixth embodiments each may also use the film of the seventh embodiment.

In the first to seventh embodiments, oxygen excited by a high frequency wave or ozone is used as oxygen of the excitation level. Alternatively, use may be made of a radical produced by removing charged particles from plasma, oxygen excited by ultraviolet rays or oxygen of the excitation level resulting from the dissociation of dinitrogen oxide.

Figure 14:
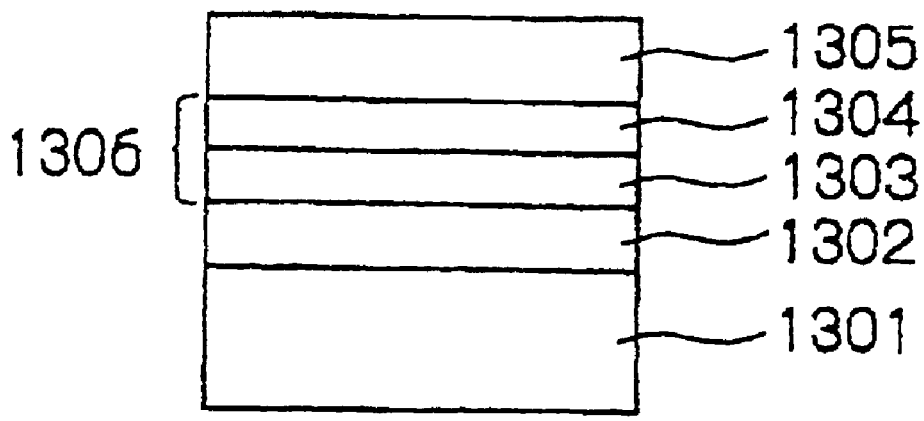
FIG. 14 is a view showing an eighth embodiment of the MR device in accordance with the present invention.

Reference will be made to FIGS. 14 through 17E for describing an eighth embodiment of the present invention. As shown in FIG. 14, a fixed layer 1302 implemented by a first ferromagnetic material, a free layer 1305 implemented by a second ferromagnetic material and a tunnel barrier layer 1306 intervening between the two layers 1302 and 1305 implement ferromagnetic tunnel junction. The fixed layer 1302 is formed on an antiferromagnetic layer 1301. The tunnel barrier layer 1306 is an insulation layer made up of a nitride layer 1303 and an oxide layer 1304. The nitride layer 1303 is constituted by a metal or semiconductor nitride and contacts the fixed layer 1302. The oxide layer 1304 is a metal or semiconductor oxide and contacts the free layer 1305.

More specifically, the nitride layer 1303 is a nitride of any one of Al, Mg, Y, lanthanoids and semiconductor. This is also true with the oxide layer 1304 except that it is an oxide. The nitride layer 1303 and oxide layer 1304 may, of course, be different from each other as to element.

The first and second ferromagnetic materials each are implemented by any one of Fe, Co, Ni, alloys thereof, NiMnSb and other conventional materials. The fixed layer 1302 or the free layer 1305 maybe a laminate of a plurality of ferromagnetic materials. For the antiferromagnetic layer 1301, use may be made of Fe—Mn, Ir—Mn, Pt—Mn, Pd—Mn or similar alloy.

While nitrogen forms a compound with various elements except for platinum, its reactivity to, e.g., metals is lower than the reactivity of oxygen to the same. It is therefore possible to form a sharp interface between an insulation layer and a magnetic layer if a nitride forms the interface. Further, as for heat resistance after the formation of the ferromagnetic tunnel junction, the above interface is more stable up to high temperature when a nitride forms the interface than when an oxide forms it. This is because the reactivity of a nitride to metals is so low, the reaction does not proceed even when temperature is raised. It follows that a nitride forming the interface successfully enhances the reliability of an MR device.

It is known that the MR ratio of a ferromagnetic tunnel junction depends on a barrier potential. A tunnel barrier layer implemented by a nitride having a low barrier potential cannot achieve a high MR ratio. By contrast, in the illustrative embodiment, the oxide with a high barrier potential exists in the tunnel barrier layer or insulation layer and realizes a high MR ratio.

Figure 15:
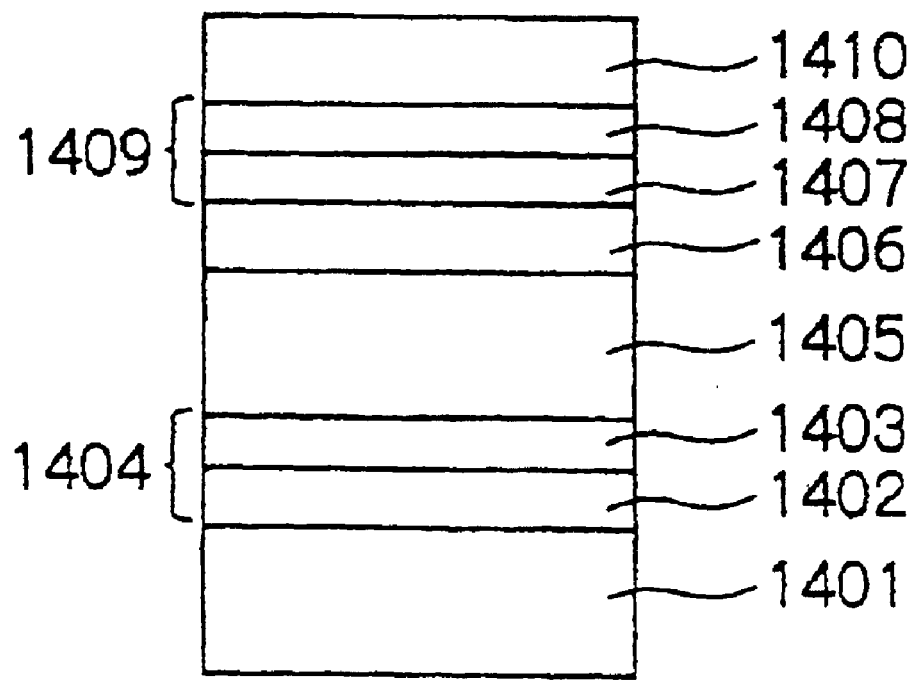
FIG. 15 is a view showing a more specific structure of the eighth embodiment.

FIG. 15 shows a basic structure common to all examples of the illustrative embodiment to be described later. As shown, the basic structure includes a buffer layer 1404, an antiferromagnetic layer 1405, a fixed layer 1406, a tunnel barrier layer 1409, and a free layer 1410. The buffer layer 1404 is made up of a 5 nm thick, Ta layer 1402 formed on a Si substrate 1401, whose surface is thermally oxidized, and a 5 nm thick $Ni_{0.81}Fe_{0.19}$ layer 1403 formed on the Ta layer 1402. The antiferromagnetic layer 1405 is implemented as a 10 nm thick, FeMn layer while the fixed layer 1406 is implemented as a 2.5 nm thick, CoFe layer. The tunnel barrier layer 1409 is made up of an aluminum nitride layer 1407 and an aluminum oxide layer 1408. The free layer 1410 is implemented as a 10 nm thick, $Ni_{0.81}Fe_{0.19}$ layer formed on the tunnel barrier layer 1409.

The buffer layer 1404 allows antiferromagnetic FeMn with a face-centered γ phase to grow. The $Ni_{0.81}Fe_{0.19}$ layer 1403 should therefore have (111) orientation. The Ta layer 1402 plays the role of a seed layer for controlling the orientation of the $Ni_{0.81}Fe_{0.19}$ layer 1403. As for the seed layer, Ta may be replaced with Nb, Ti, Hf or Zr, if desired. Also, ferromagnetic FeMn may be replaced with Ir—Mn or Pt—Mn by way of example.

Two specific procedures for producing the MR device shown in FIG. 15 will be described hereinafter. FIGS. 16A through 16E show a first procedure. First, as shown in FIG. 10A, a Si substrate 1501 had its surface thermally oxidized. A buffer layer 1504, a 10 nm thick, antiferromagnetic layer 1505, a 2.5 nm thick, fixed layer 1506 and a 0.7 nm thick first Al layer 1507 were sequentially formed on the Si substrate 1501 by sputtering in the same vacuum. The buffer layer 1504 was made up of a 5 nm thick, Ta layer 1502 and a 5 nm thick, $Ni_{0.81}Fe_{0.19}$ layer 1503. The antiferromagnetic layer 1505 and fixed layer 1506 were formed of FeMn and CoFe, respectively. To form such layers, use was made of a multi-source DC sputtering apparatus equipped with the targets of the individual substances. The background pressure before film forming was $1 \times 10^{-6}$ Pa or below while the Ar pressure during sputtering was 0.7 Pa.

Figure 16A:
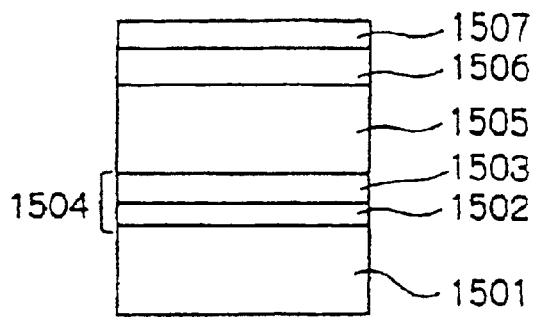
FIGS. 16A through 16E are views demonstrating a first procedure applicable to the eighth embodiment.
Figure 16D:
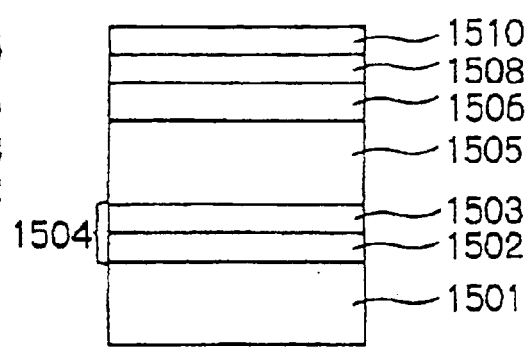
Figure 16B:
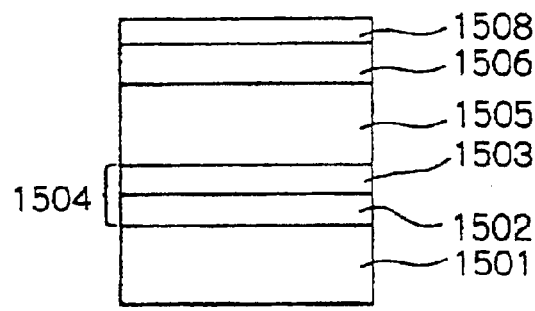

As shown in FIG. 16B, nitrogen excited by a 13.56 MHz, 80 W high frequency wave was fed to the surface of the first Al layer 1507 to thereby form an aluminum nitride layer 1508. At this instant, pressure inside the sputtering chamber was $1 \times 10^{-4}$ Pa. Why excited nitrogen is used is that it reacts to a metal or a semiconductor little and therefore causes almost no reaction to occur at the ground level.

Figure 16E:
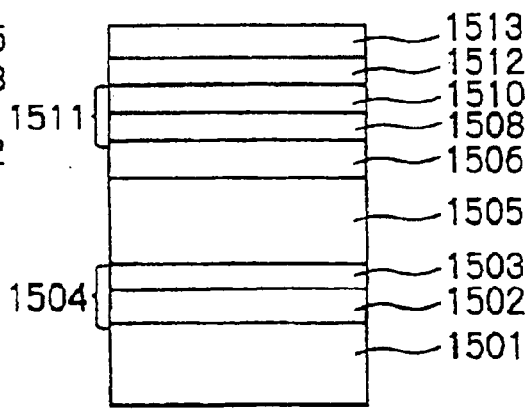
Figure 16C:
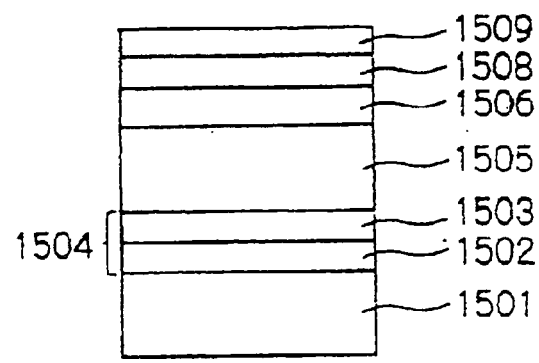

As shown in FIG. 16C, the sputtering chamber was exhausted to the background pressure, and then a 0.8 nm thick, second Al layer 1509 was formed by sputtering. Subsequently, as shown in FIG. 16D, oxygen excited by a 13.56 MHz, 80 W high frequency wave was fed to the surface of the second Al layer 1509 to thereby form an aluminum oxide layer 1510. The aluminum nitride layer 1508 and aluminum oxide layer 1510 constituted a tunnel barrier layer 1511. Further, as shown in FIG. 16E, the sputtering chamber was exhausted to the background pressure, and then a 10 nm thick $Ni_{0.81}Fe_{0.19}$ free layer 1512 was formed by sputtering. Finally, a 5 nm thick, Ta layer 1513 was formed for a protection purpose.

A magnetic field of 100 Oe was continuously applied to the substrate 1501 in one direction throughout the process described above. After the process, the entire laminate was subjected to heat treatment at 200° C. for 1 hour with a magnetic field of 500 Oe being applied to the substrate 1501 in the above one direction.

After the step shown in FIG. 16E, the laminate was finely processed by photolithography so as to produce 2 μm square, MR devices.

Figure 17A:
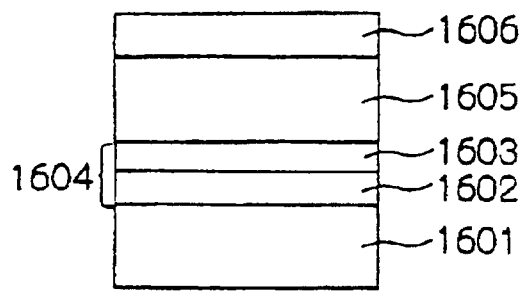
FIGS. 17A through 17E are views demonstrating a second procedure also applicable to the eighth embodiment.

FIGS. 17A through 17F show a second procedure. First, as shown in FIG. 17A, a Si substrate 1601 had its surface thermally oxidized. A buffer layer 1604, a 10 nm thick, antiferromagnetic layer 1605 and a 2.5 nm thick, fixed layer 1606 were sequentially formed on the Si substrate 1601 by sputtering in the same vacuum. The buffer layer 1604 was made up of a 5 nm thick, Ta layer 1602 and a 5 nm thick, $Ni_{0.81}Fe_{0.19}$ layer 1603. The antiferromagnetic layer 1605 and fixed layer 1606 were formed of FeMn and CoFe, respectively.

Figure 17D:
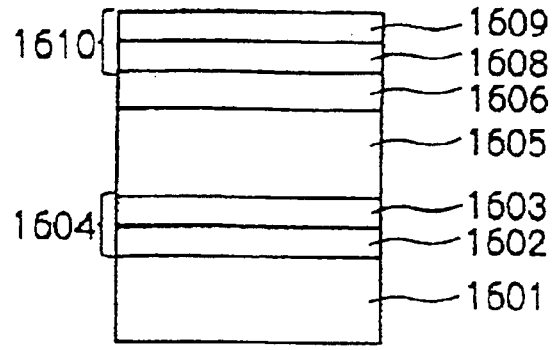
Figure 17B:
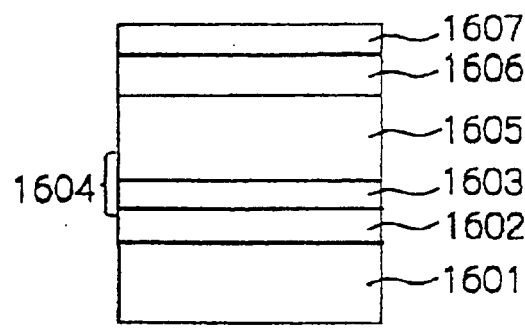
Figure 17E:
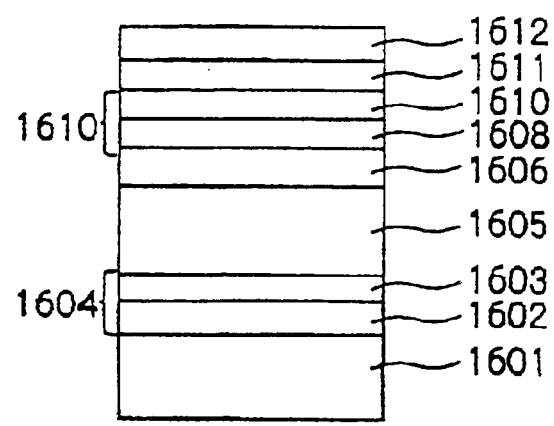
Figure 17C:
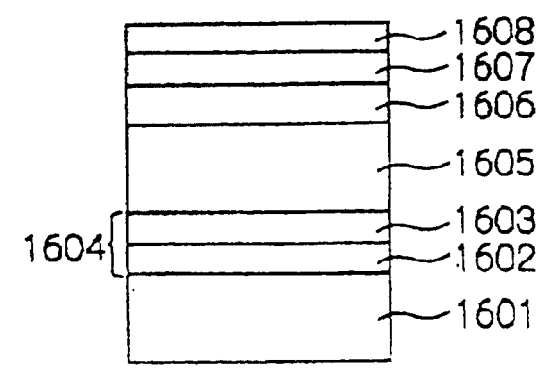

As shown in FIG. 17B, an evaporation source positioned in the same vacuum source as used for sputtering caused aluminum nitride to evaporate to thereby form a 1 nm thick aluminum nitride layer 1607. Subsequently, as shown in FIG. 17C, a 0.7 nm thick, Al layer 1608 was formed by sputtering. As shown in FIG. 17D, oxygen excited by a 13.56 MHz, 80 W high frequency wave was fed to the surface of the surface of the Al layer 1608 to thereby form an aluminum oxide layer 1609. The aluminum nitride layer 1607 and aluminum oxide layer 1609 constituted a tunnel barrier layer 1610. As shown in FIG. 17E, the sputtering chamber was exhausted to the background pressure, and then a 10 nm thick, $Ni_{0.81}Fe_{0.19}$ free layer 1611 was formed by sputtering. Finally, a 5 nm thick, Ta layer 1612 was formed for a protection purpose.

Alternatively, to form the nitride aluminum layer 1407, aluminum may be evaporated with nitrogen excited by, e.g., a high frequency wave being sent into the vacuum chamber. Also, aluminum may be sputtered by a sputter gas to which nitrogen is added. To form the aluminum oxide layer 1408, use may be made of vacuum deposition using aluminum oxide as a material or the evaporation or sputtering of aluminum effected in an oxidizing atmosphere.

FIG. 26 compares a fourteenth to a seventeenth example of the illustrative embodiment and a seventh and an eighth comparative example as to characteristics determined by measurement. In the seventh and eighth comparative examples, oxygen excited by a high frequency wave was used to oxidize a 1.5 nm thick, aluminum layer to thereby form a tunnel barrier layer.

The fourteenth to sixteenth examples used the first procedure described with reference to FIGS. 16A through 16E. The aluminum nitrifying time and oxidizing time in the fourteenth example were 5 minutes and 10 minutes, respectively. The aluminum nitrifying time and oxidizing time in the fifteenth example were 10 minutes each. The nitrifying time and oxidizing time in the fourteenth example were 10 minutes and 15 minutes, respectively. The aluminum nitrifying time was 10 minutes and 20 minutes in the seventh and eighth comparative examples, respectively.

The seventeenth example used the second procedure shown in FIGS. 17A through 17E. In this example, aluminum nitride was used as a material for forming an aluminum nitride layer by evaporation. Aluminum was then deposited on the aluminum nitride layer and then oxidized by oxygen excited by a high frequency wave for 10 minutes, forming an aluminum oxide layer.

In each of the examples and comparative examples, fifty MR devices were prepared and had their magnetic resistance characteristics measured.

As FIG. 26 indicates, in the fourteenth to sixteen examples, although the junction resistance (standardized resistance) depends mainly on the aluminum oxidizing time, the MR ratio of 35% or above is achievable. In the seventh and eighth comparative examples, while the junction resistance varies with the oxidizing time, the MR ratio is as low as 26% or below.

The junction resistance and MR ratio of the seventeen example are close to the junction resistance and MR ratio of the fifteenth example. This indicates that a high MR ratio is attainable without regard to the method of forming the aluminum nitride layer. It will also be seen that the junction of the illustrative embodiment has a junction resistance determined mainly by aluminum oxide.

The fourteenth to seventeen examples achieve a yield of 100%, but the yields of the seventh and eighth comparative examples are far short of 100%. This shows that a difference in the interface structure between the insulation layer and the underlying ferromagnetic layer has influence on resistance to voltage as well.

Further, the MR characteristics were measured after heat treatment at 300° C. for 1 hour. The measurement showed that the fourteenth to seventeenth examples all had an MR ratio of 50% or above. By contrast, the MR ratios of the seventh and eighth comparative examples were as low as 5% or below. It will therefore be seen that the fourteenth to seventeenth examples are superior to the seventh and eighth comparative examples as to heat resistance.

As stated above, in the illustrative embodiment, the interface between the fixed layer and the ferromagnetic layer is formed of a material little reactive to a ferromagnetic material, compared to the other portions. The portions other than the interface have a ferromagnetic tunnel junction implemented by the tunnel barrier layer or insulation layer, which is more insulative than the interface. Such an interface forms a sharp interface with respect to the ferromagnetic layer and therefore obviates the fall of the MR ratio ascribable to spin diffusion. At the same time, the regions other than the interface insure a high MR ratio. The eighth embodiment therefore achieves a high MR ratio and high reliability.

The illustrative embodiment has a nitride at the interface contacting with the underlying magnetic layer and has an oxide thereon. Alternatively, the interface between the Insulation layer and the ferromagnetic layer may be provided with a nitride.

In the illustrative embodiment, the oxide layer and nitride layer form a tunnel barrier layer. However, the crux is that the tunnel barrier layer be an insulation layer including a substance with high barrier potential and a substance less reactive to a ferromagnetic material than the above substance.

Figure 18:
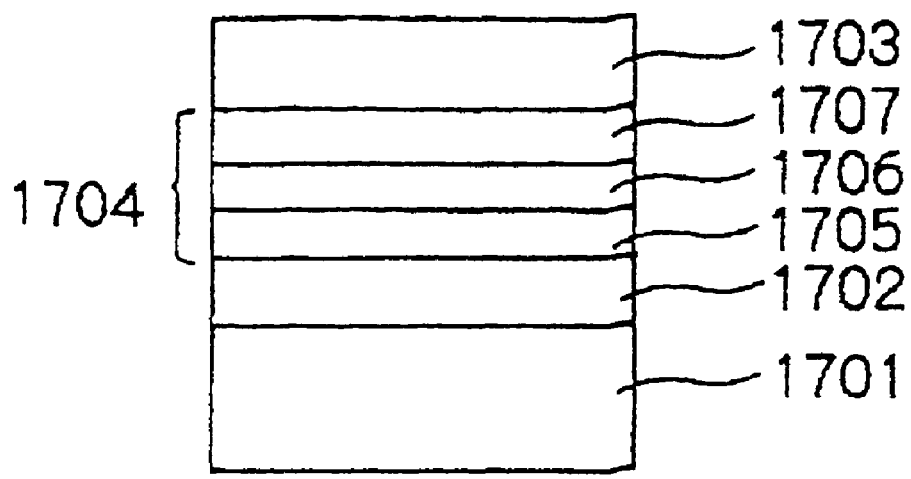
FIG. 18 is a view showing a ninth embodiment of the MR device in accordance with the present invention.

A ninth embodiment of the present invention will be described with reference to FIGS. 18 through 21. The ninth embodiment is identical with the eighth embodiment except for the structure of the tunnel barrier layer. As shown in FIG. 18, in the illustrative embodiment, a ferromagnetic tunnel junction includes a fixed layer 1702 implemented by a first ferromagnetic material, a free layer 1703 formed of a second ferromagnetic material, and a tunnel barrier layer 1704 intervening between the two layers 1702 and 1703.

The fixed layer 1702 is formed on a ferromagnetic layer 1701. The tunnel barrier layer 1704 is made up of a first nitride layer 1705, an oxide layer 1706, and a second nitride layer 1707. The first nitride layer 1705 is formed of a first metal or semiconductor nitride and contacts the fixed layer 1702. The second nitride layer 1707 is formed of a second metal or semiconductor nitride and contacts the free layer 1703. The oxide layer 1706 is formed of a metal or semiconductor oxide and intervenes between the first and second nitride layers 1705 and 1707.

The first and second nitride layers 1705 and 1707 each are a nitride of any one of Al, Mg, Y, lanthanoids and semiconductor. The oxide layer 1706 is an oxide of any one of Al, Mg, Y, lanthanoids and semiconductor. The first and second nitride layers 1705 and 1707 and oxide layer 1706 each may even be implemented by a particular element.

The first and second ferromagnetic materials each are implemented by any one of Fe, Co, Ni, alloys thereof, NiMnSb and other conventional materials. The fixed layer 1702 or the free layer 1705 may be a laminate of a plurality of ferromagnetic materials. For the antiferromagnetic layer 1701, use may be made of Fe—Mn, Ir—Mn, Pt—Mn, Pd—Mn or similar alloy.

Figure 19:
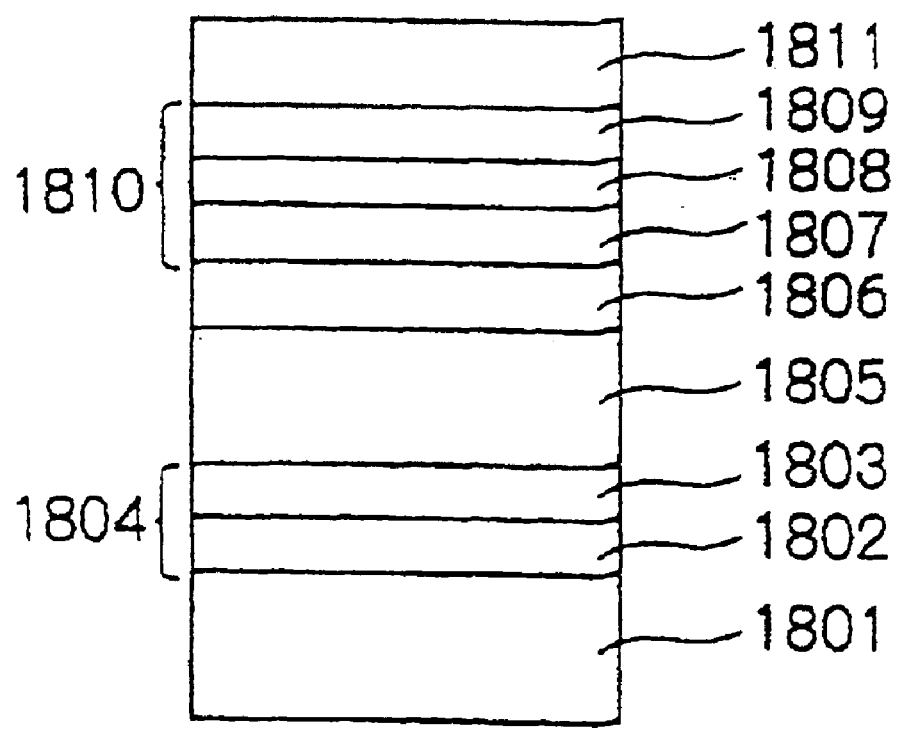
FIG. 19 is a view showing a more specific configuration of the ninth embodiment.

Examples of the illustrative embodiment will be described hereinafter. FIG. 19 shows a basic structure common to examples to be described later. As shown, the basic structure includes a buffer layer 1804, a antiferromagnetic layer 1805, a fixed layer 1806, a tunnel barrier layer 1810, and a free layer 1811.

The buffer layer 1804 is made up of a 5 nm thick, Ta layer 1802 formed on a Si substrate 1801, whose surface is thermally oxidized, and a 5 nm thick, $Ni_{0.81}Fe_{0.19}$ layer 1803 formed on the Ta layer 1802. The antiferromagnetic layer 1805 is implemented as a 10 nm thick, FeMn layer while the fixed layer 1806 is implemented as a 2.5 nm thick, CoFe layer. The tunnel barrier layer 1810 is made up of a first aluminum nitride layer 1807, an aluminum oxide layer 1808, and a second aluminum nitride layer 1809. The free layer 1811 is implemented as a 10 nm thick, $Ni_{0.81}Fe_{0.19}$ layer formed on the tunnel barrier layer 1810.

The buffer layer 1804 allows antiferromagnetic FeMn with a face-centered γ phase to grow. The $Ni_{0.81}Fe_{0.19}$ layer 1803 should therefore have (111) orientation. The Ta layer 1802 plays the role of a seed layer for controlling the orientation of the $Ni_{0.81}Fe_{0.19}$ layer 1803. As for the seed layer, Ta may be replaced with Nb, Ti, Hf or Zr, if desired. Also, ferromagnetic FeMn may be replaced with Ir—Mn or Pt—Mn by way of example.

Figure 20A:
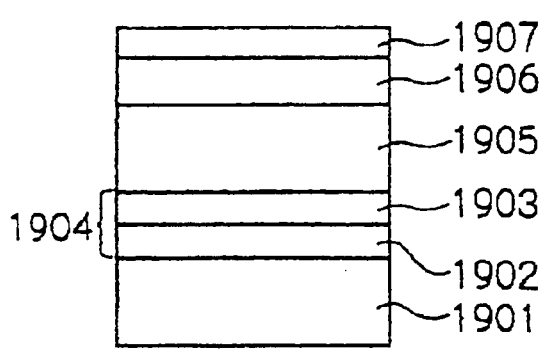
FIGS. 20A through 20E are views showing a procedure applicable to the ninth embodiment.

A procedure for producing the MR device shown in FIG. 19 will be described hereinafter. First, as shown in FIG. 20A, a Si substrate 1901 had its surface thermally oxidized. A buffer layer 1904, a 10 nm thick, antiferromagnetic layer 1905, a 2.5 nm thick, fixed layer 1906 and a 0.7 nm thick, first Al layer 1907 were sequentially formed on the Si substrate 1901 in the same vacuum. The buffer layer 1904 was made up of a 5 nm thick, Ta layer 1902 and a 5 nm thick, $Ni_{0.81}Fe_{0.19}$ layer 1903. The antiferromagnetic layer 1905 and fixed layer 1906 were formed of FeMn and CoFe, respectively. To form such layers, use was made of a multi-source DC sputtering apparatus equipped with the targets of the individual substances. The background pressure before film forming was $1 \times 10^{-6}$ Pa or below while the Ar pressure during sputtering was 0.7 Pa.

Figure 20D:
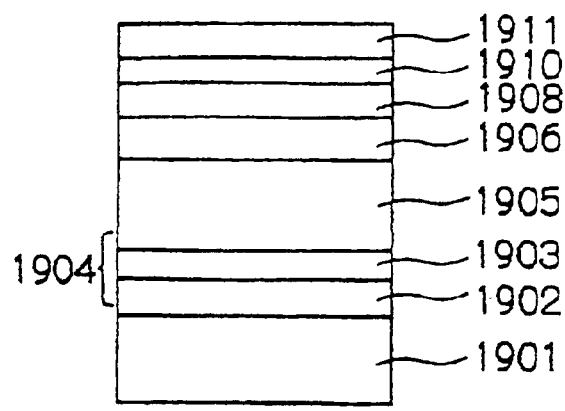
Figure 20B:
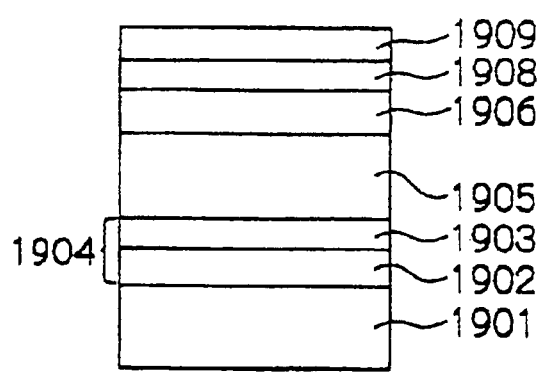

As shown in FIG. 20B, nitrogen excited by a 13.56 MHz, 80 W high frequency wave was fed to the surface of the first Al layer 1907 to thereby form a first aluminum nitride layer 1908. Further, the sputtering chamber was exhausted to the background pressure, and then a 0.7 nm thick, second Al layer 1909 was formed by sputtering.

Figure 20E:
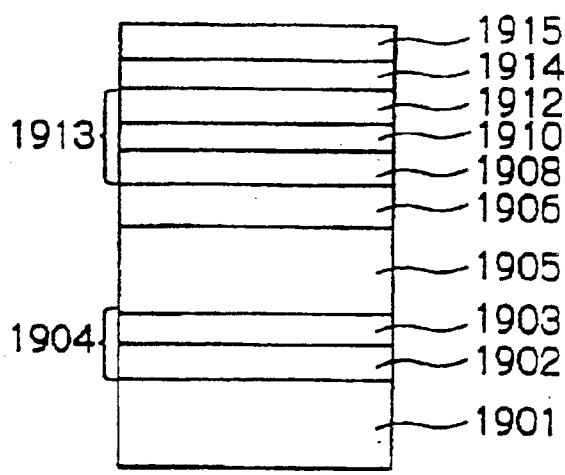
Figure 20C:
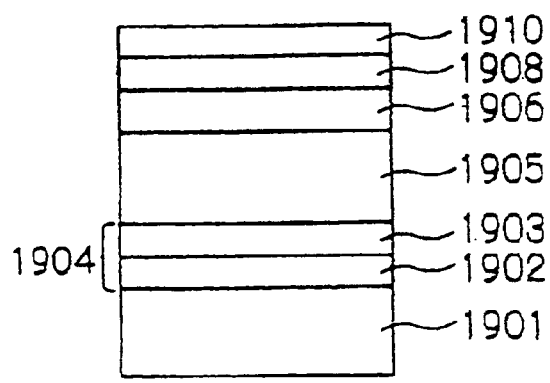

Subsequently, as shown in FIG. 20C, oxygen excited by a high frequency wave was fed to the surface of the second Al layer 1909 to thereby form an aluminum oxide layer 1910. Further, as shown in FIG. 20D, the sputtering chamber was again exhausted to the background pressure, and then a 0.7 nm thick, third Al layer 1911 was formed.

As shown in FIG. 20E, nitrogen excited by a high frequency wave was introduced to oxidize the third Al layer 1911 for thereby forming a second aluminum nitride layer 1912. The first nitride aluminum layer 1908, aluminum oxide layer 1910 and second aluminum nitride layer 1912 constituted a tunnel barrier layer 1913. Subsequently, a 10 nm thick, $Ni_{0.81}Fe_{0.19}$ free layer 1914 was formed on the second aluminum nitride layer 1912, and then a 5 nm thick, Ta layer 1915 was formed for a protection purpose.

A magnetic field of 100 Oe was continuously applied to the substrate 1901 in one direction throughout the process described above. After the process, the entire laminate was subjected to heat treatment at 200° C. for 1 hour with a magnetic field of 500 Oe being applied to the substrate 1901 in the above one direction.

After the step shown in FIG. 20E, the laminate was finely processed by photolithography so as to produce 2 μm square, MR devices.

The first and second aluminum nitride layers 1908 and 1912 may alternatively be formed by evaporation or sputtering using aluminum nitride as a material. To form the first and second aluminum nitride layers 1908 and 1912, evaporation may be effected with nitrogen excited by, e.g., a high frequency wave being introduced into a vacuum vessel. Another specific method of forming the first and second aluminum nitride layers 1908 and 1912 is sputtering aluminum with a sputter gas to which nitrogen is added.

The aluminum oxide layer 1910 may alternatively be formed by the vacuum evaporation or sputtering of aluminum oxide or by the vacuum evaporation or sputtering of aluminum effected in an oxidizing atmosphere.

FIG. 27 compares an eighteenth to a twentieth example of the illustrative embodiment and a ninth comparative example as to characteristics determined by measurement. The eighteenth to twentieth examples used the procedure described with reference to FIGS. 20A through 20E. In the eighteenth to twentieth examples, the first to third Al layers 1907, 1909 and 1911 were 0.7 nm thick each while the nitrifying time of the first and third Al layers 1907 and 1911 was 20 minutes. The oxidizing time of the second Al layer 1909 was 5 minutes in the eighteenth example, 10 minutes in the nineteenth embodiment or 15 minutes in the twentieth embodiment. The ninth comparative example nitrified a 2.1 nm thick, aluminum layer with nitrogen plasma for 50 minutes to thereby form an insulation layer, which did not contain an oxide layer.

As shown in FIG. 27, the ninth comparative example has an MR ratio of 14% while the eighteenth to twentieth examples have MR ratios as high as 34% to 36%. This indicates that whether or not aluminum oxide with a high barrier potential is present has decisive influence on the MR ratio. Further, the eighteenth to twentieth examples and the ninth example all have comparable high yields. This is presumably because aluminum nitride forming the interface between the insulation layer and the ferromagnetic layer made the interface sharp and stable.

Figure 21:
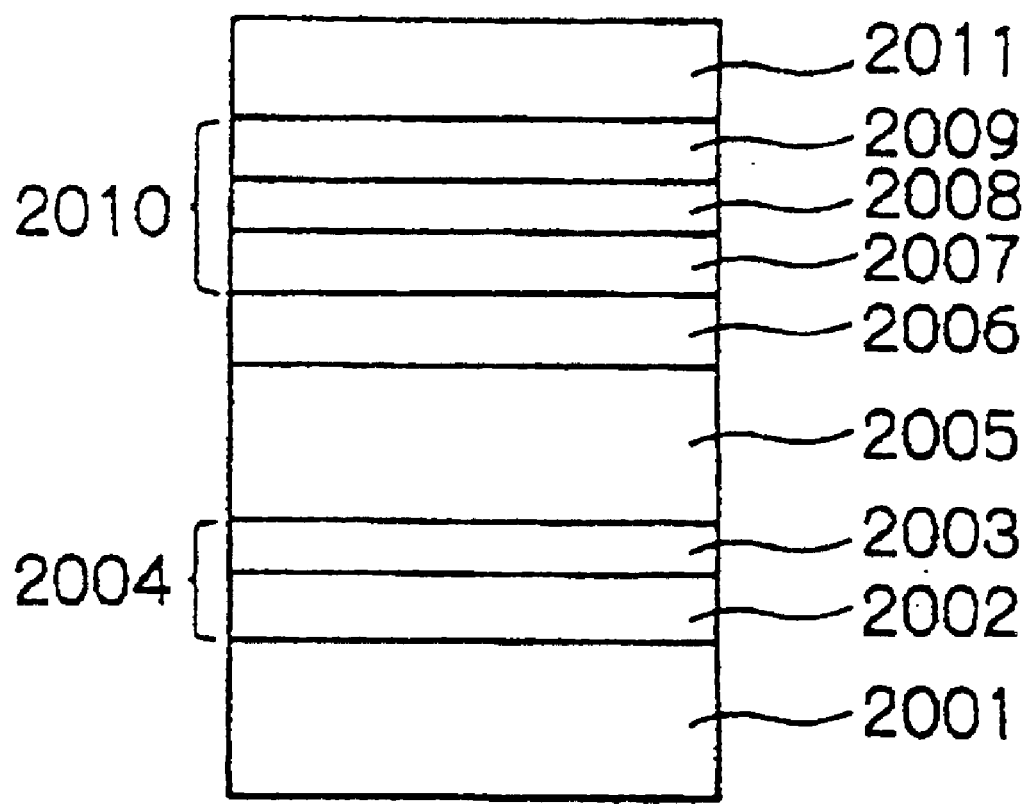
FIG. 21 is a view showing a twenty-first example included in the ninth embodiment.

FIG. 21 shows a structure representative of a twenty-first example of the illustrative embodiment. As shown, the structure includes a buffer layer 2004, an antiferromagnetic layer 2005, a fixed layer 2006, a tunnel barrier layer 2010, and a free layer 2011.

The buffer layer 2004 is made up of a 5 nm thick, Ta layer 2002 formed on a Si substrate 2001, whose surface is thermally oxidized, and a 5 nm thick, $Ni_{0.81}Fe_{0.19}$ layer 2003 formed on the Ta layer 2002. The antiferromagnetic layer 2005 is implemented as a 10 nm thick, FeMn layer while the fixed layer 2006 is implemented as a 2.5 nm thick, CoFe layer. The tunnel barrier layer 2010 is made up of a first silicon nitride layer 2007, an aluminum oxide layer 2008, and a second silicon nitride layer 2009. The free layer 2011 is implemented as a 10 nm thick, $Ni_{0.81}Fe_{0.19}$ layer formed on the tunnel barrier layer 2010.

The twenty-first example is also practicable with the procedure shown in FIGS. 20A through 20E only if silicone layers are substituted for the first and third Al layers 1907 and 1911. To form the first and second silicon nitride layers 2007 and 2009, excited nitrogen was emitted toward 1.0 nm thick silicon for 30 minutes. To form the aluminum oxide layer 2008, excited oxygen was emitted toward 0.7 nm thick aluminum for 10 minutes.

FIG. 28 lists the characteristics of the twenty-first example determined by measurement. As shown, the twenty-first example is comparable with the examples using aluminum nitride as to characteristics. The same results are achievable even if silicon is replaced with any other semiconductor, e.g., germanium.

As for the eighth and ninth embodiments shown and described, the insulation layer does not have to form a sharp interface between the layers forming it. For example, the interface may have a continuous graded composition, if desired. Also, another specific method of forming the nitride layer and oxide layer in the insulation layer is forming the nitride layer on the ferromagnetic layer close to the substrate and then feeding oxygen of the ground level or the excitation level to the surface of the nitride layer to thereby form the oxide layer. Further, the thickness of the nitride layer and that of the oxide layer forming the insulation layer may be selected in accordance with a junction resistance and an MR ratio required of an MR device. In addition, nitrogen and oxygen excited by a high frequency wave may be replaced with nitrogen and oxygen excited by ultraviolet rays or a radical produced by removing charged particles from plasma.

In the first to ninth embodiments, the antiferromagnetic layer, fixed layer, tunnel barrier layer and free layer are sequentially formed on the Si substrate in this order. Alternatively, the free layer, tunnel barrier layer, fixed layer and antiferromagnetic layer may be formed on the Si layer in this order. The kinds, thicknesses and fabricating conditions of the magnetic layers shown and described are only illustrative. The crux is that the ferromagnetic tunnel phenomenon can be observed. Further, in the illustrative embodiments, the spin valve technology is used to provide the two ferromagnetic layers with a relative angle in the direction of magnetization. Alternatively, a junction based on a difference in coercive force between two ferromagnetic materials, e.g., Fe and Co may be used.

In summary, it will be seen that the present invention provides an MR device and a method of producing the same having various unprecedented advantages, as enumerated below.

(1) When oxygen of the ground level oxidizes a metal or a semiconductor, a ferromagnetic material constituting a first ferromagnetic layer is not oxidized, but the metal or the semiconductor partly remains non-oxidized. The subsequent oxidation using oxygen of the excitation level causes oxidation in an insulation layer to proceed, oxidizing the non-oxidized part.

(2) Oxygen of the ground level oxidizes at least the surface of the metal or semiconductor layer beforehand. Therefore, the oxidation using oxygen of the excitation level proceeds more slowly than oxidation that directly oxidizes a metal or a semiconductor with oxygen of the excitation level, and is easy to control.

(3) When oxygen of the excitation level oxidizes a second metal or semiconductor layer, an oxide layer formed by oxidizing a first metal or semiconductor layer with oxygen of the ground level is slowly oxidized. Such slow oxidation is easy to control.

(4) An oxide of metal or that of semiconductor is deposited on a first ferromagnetic layer. The oxide prevents the underlying magnetic layer from being oxidized and prevents non-oxidized metal or semiconductor from remaining at an interface. Further, the oxide is further oxidized by oxygen of the excitation level, so that the loss of oxygen is obviated.

(5) An interface contacting the ferromagnetic material of a first ferromagnetic layer is little reactive to the ferromagnetic material. Portions other than the interface have a ferromagnetic tunnel junction having a tunnel barrier layer, which is implemented by an insulation layer more insulative than the interface. Such an interface is sharp with respect to the ferromagnetic layer, thereby preventing the MR ratio from decreasing due to spin diffusion. Further, the portions other than the interface are highly insulative and implement a high MR ratio.

Various modifications will become possible for those skilled in the art after receiving the teachings of the present disclosure without departing from the scope thereof.

What is claimed is:

1. A magnetoresistive (MR) device comprising:
a first ferromagnetic layer;
a first insulation layer having a first composition disposed on the first ferromagnetic layer;
a second insulation layer having a second composition different from the first composition disposed on the first insulation layer, the first and second insulation layers together forming a tunnel barrier layer; and
a second ferromagnetic layer disposed on the second insulation layer;
wherein the first composition is less reactive with a composition of the first ferromagnetic layer than is the second composition.

2. The MR device of claim 1, wherein the second composition is an oxide of one of a metal and a semiconductor.

3. The MR device of claim 2, wherein the first composition is a nitride of one of a metal and a semiconductor.

4. The MR device of claim 3, wherein an interface between the first and second insulation layers is a continuous grade.

* * * * *